(12) United States Patent
Akita et al.

(10) Patent No.: US 6,560,163 B2
(45) Date of Patent: May 6, 2003

(54) SEMICONDUCTOR DEVICE INCLUDING A REPETITIVE PATTERN

(75) Inventors: Hironobu Akita, Yokohama (JP); Shinichiro Shiratake, Yokohama (JP); Fumihiro Kohno, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/040,479

(22) Filed: Jan. 9, 2002

(65) Prior Publication Data

US 2002/0057589 A1 May 16, 2002

Related U.S. Application Data

(63) Continuation of application No. 09/772,069, filed on Jan. 30, 2001, which is a continuation of application No. 09/471,038, filed on Dec. 23, 1999, now Pat. No. 6,212,090.

(30) Foreign Application Priority Data

Dec. 25, 1998 (JP) ............................................ 10-369282
Dec. 20, 1999 (JP) ............................................ 10-361406

(51) Int. Cl.$^7$ .................................................. G11C 8/00
(52) U.S. Cl. ..................................... 365/230.06; 365/63
(58) Field of Search .............................. 365/230.06, 63, 365/51, 189.08

(56) References Cited

U.S. PATENT DOCUMENTS

| | | | |
|---|---|---|---|
| 5,175,128 A | 12/1992 | Ema et al. ................... | 437/229 |
| 5,495,440 A | 2/1996 | Asakura ...................... | 365/149 |
| 5,793,695 A | 8/1998 | Kohno | |
| 5,825,714 A | 10/1998 | Kohno | |
| 5,838,629 A | 11/1998 | Kohno | |
| 6,040,605 A | 3/2000 | Sano et al. ................... | 257/369 |
| 6,118,697 A * | 9/2000 | Tanzawa et al. ........ | 365/185.11 |

FOREIGN PATENT DOCUMENTS

| | | |
|---|---|---|
| JP | 7-141856 | 6/1995 |
| JP | 9-102592 | 4/1997 |
| JP | 9-147598 | 6/1997 |
| JP | 10-256512 | 9/1998 |
| JP | 10-335601 | 12/1998 |

\* cited by examiner

*Primary Examiner*—David Nelms
*Assistant Examiner*—Thong Le
(74) *Attorney, Agent, or Firm*—Banner & Witcoff, Ltd.

(57) ABSTRACT

The present invention provides a DRAM in which a first repetitive unit including a plurality of decoders for selecting a plurality of word lines and a second repetitive unit having the same arrangement as that of the first repetitive unit are arranged symmetrically with respect a boundary region therebetween. The first and second repetitive units have a wire and a contact located on a boundary portion therebetween in common.

34 Claims, 31 Drawing Sheets

| A3 | 1 | | | | | | | | |
| A2 | 0 | | | | | 0 | | | |
| A1 | 0 | 1 | 1 | 1 | 0 | | 1 | 1 | |
| A0 | 0 | 1 | 0 | 1 | 0 | 1 | 0 | 1 | 0 |
| WL NUMBER | 8 | 7 | 6 | 5 | 4 | 3 | 2 | 1 | 0 |

FIG. 8

SEMICONDUCTOR DEVICE INCLUDING A REPETITIVE PATTERN

This application is a Continuation of U.S. application Ser. No. 09/772,069 filed on Jan. 30, 2001, U.S. Pat. No. 6,362,999 which is a Continuation of U.S. application Ser. No. 09/471,038, filed on Dec. 23, 1999 now U.S. Pat. No. 6,212,090.

BACKGROUND OF THE INVENTION

The present invention relates to a semiconductor device including a repetitive pattern and, more specifically, to a dynamic semiconductor device (DRAM) including a repetitive pattern such as a word-line driving circuit.

This application is based on Japanese Patent Application No. 10-369282 filed Dec. 25, 1998, and Japanese Patent Application No. 10-361406 filed Dec. 20, 1999, the contents of both are incorporated herein by reference.

Recently DRAMs have been decreased greatly in size of element structure. In particular, word lines for selecting memory cells arranged in a memory cell array are formed under design rules. The width of one word line and the interval between adjacent word lines are decreased further. Moreover, a word-line driving circuit for selectively driving such a word line needs to be disposed in a narrow area. Some prior art methods have been therefore developed.

FIGS. 1 to 3 each illustrate a relationship between word lines and word-line driving circuits as one of the prior art methods. In FIG. 1, word-line driving circuits 210 connected to their respective word lines WL0, WL1, . . . , are arranged on one side of a memory cell array (MCA) 211. In the actual pattern layout, a word-line driving circuit is difficult to dispose between fine word lines. It is thus thought that the word-line driving circuits 210 are arranged on either side of the memory cell array 211 as shown in FIGS. 2 and 3. FIG. 2 is directed to a method of driving adjacent word lines alternately one by one by means of the word-line driving circuits 210 arranged on both sides of the memory cell array 211. FIG. 3 is directed to a method of driving adjacent word lines alternately two by two by means of the word-line driving circuits 210 arranged on both sides of the memory cell array 211. of the above three methods shown in FIGS. 1 to 3, an appropriate one to be processed the most easily is selected according to a process technique such as lithography and etching.

When the word-line driving circuits are arranged as shown in FIGS. 1 to 3, a plurality of word-line driving circuits corresponding to a plurality of word lines are combined into one repetitive unit. A plurality of such repetitive units are arranged. In a normal DRAM, word lines are selected by decoding a low-order n bit ($n \geq 1$) input address. One repetitive unit therefore coincides with $2^n$ word lines. Assuming that an input address is two bits of A1 and A0, the word-line driving circuits connected to four word lines corresponding to logical values (0, 0), (0, 1), (1, 0) and (1, 1) of (A1, A0), constitute one repetitive unit.

FIGS. 4 and 5 show a circuit arrangement of the above repetitive unit and a layout of wires. Referring to these figures, word-line driving circuits 210 (referred to as word-line decoders hereinafter) are each constituted of a NAND circuit 210a and an inverter circuit 210b. A first metal wiring layer M1 is connected to an input terminal of the NAND circuit 210a. Address signals (low-order bits of an input address) A0, /A0, A1 and /A1 (/ indicates an inverted signal) are supplied to a plurality of second metal wiring layers M2 formed above the first metal wiring layer M1. These layers M1 and M2 are connected by a contact CT located in a desired position. The high-order bit of the input address is supplied to the input terminal of the NAND circuit 210a, but its description is omitted for simplification.

BRIEF SUMMARY OF THE INVENTION

For DRAMs, it is desired that the chip area can be decreased as much as possible to lower manufacturing costs. In particular, a reduction in the area of a word-line decoder including a plurality of repetitive units having the same arrangement is very important in view of a reduction in the area of the entire chip. It can be thought that adjacent repetitive units have a contact and a wiring layer in common in order to reduce the area of a word-line decoder. In the layout shown in FIG. 5, it is difficult to share a contact with adjacent repetitive units.

More specifically, as illustrated in FIG. 6, when a plurality of repetitive units A and B are arranged adjacent to each other, the locations of contacts CT1 and CT2 on the boundary portions of the units A and B differ from each other. In other words, the contact CT1 on the boundary portion of the repetitive unit A is connected to a wiring layer M2 supplied with an address signal /A0, while the contact CT2 on the boundary portion of the repetitive unit B is connected to a wiring layer M2 supplied with an address signal A1. It is thus difficult to share the contacts CT1 and CT2 with the repetitive units A and B. In FIG. 6, word-line decoders for selecting word lines WL1 and WL2 in both the repetitive units A and B, are omitted.

As described above, in the prior art semiconductor device, adjacent repetitive units cannot have a contact located on a boundary portion therebetween in common. It was therefore difficult to reduce the layout area of a word-line decoder, with the result that neither the chip area nor the manufacturing costs could be decreased.

Accordingly, the object of the present invention is to provide a semiconductor device capable of decreasing in chip area and manufacturing costs.

To attain the above object, according to a first aspect of the present invention, there is provided a semiconductor device comprising a first repetitive unit including a plurality of decoders for selecting at least two wires, and a second repetitive unit whose arrangement is equal to that of the first repetitive unit and which is arranged adjacent to and symmetrically with the first repetitive unit, the first and second repetitive units having a wire and a contact, which are located on a boundary portion of the first and second repetitive units, in common.

According to a second aspect of the present invention, there is provided a semiconductor device comprising a first repetitive unit including a plurality of decoders for selecting a word line, a plurality of input wires of each of the decoders being connected to a plurality of address wires, and a second repetitive unit arranged symmetrically with and adjacent to the first repetitive unit and having a plurality of decoders for selecting a word line, a plurality of input wires of each of the decoders being connected to a plurality of address wires, wherein the first and second repetitive units have an input wire of the decoders and a contact between the input wire and the address wire, which are located on a boundary portion of the first and second repetitive units, in common.

According to a third aspect of the present invention, there is provided a semiconductor device comprising a decoder for outputting a plurality of word-line driving voltages in accordance with an address signal, a plurality of wires connected to the decoder and supplied with the plurality of word-line driving voltages, a first repetitive unit including a plurality of driving circuits whose output terminals are connected to word lines and connected to the plurality of wires, and a second repetitive unit including a plurality of driving circuits whose output terminals are connected to word lines and contacts connected to the plurality of wires, the contacts of the second repetitive unit being arranged symmetrically with contacts of the first repetitive unit, wherein driving circuits located on a boundary portion between the first and second repetitive units have a contact connected to one of the plurality of wires in common.

The semiconductor device of the present invention enables adjacent first and second repetitive units to have an element on a boundary portion therebetween in common. An area for arranging the first and second repetitive units can thus be reduced.

Moreover, in one of the first and second repetitive units, when the output terminals of adjacent decoders are connected to cross each other, the internal wires of adjacent decoders are connected to cross each other, the input terminals of adjacent decoders are connected to cross each other, both a power supply wire and a contact are shared with adjacent decoders, or the output terminals of driving circuits are connected to cross each other, a give stress voltage can be applied between all adjacent word lines in a test mode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8 is a table showing an example of address assignment in the semiconductor device of FIG. 7;

DETAILED DESCRIPTION OF THE INVENTION

Embodiments of the present invention will now be described with reference to the accompanying drawings.
(First Embodiment)

Figure 1:
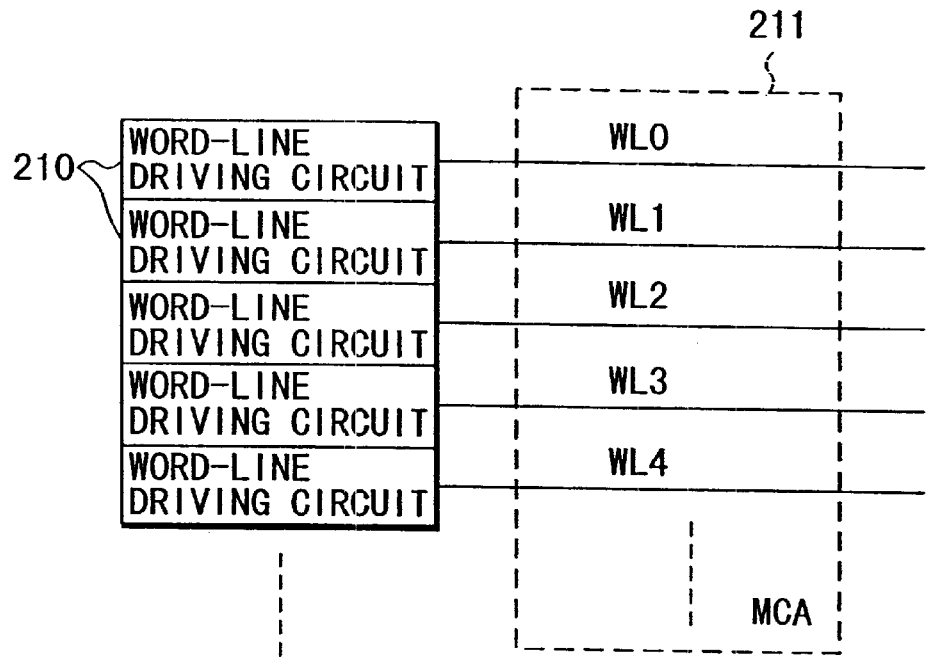
FIG. 1 is a first schematic block diagram showing a relationship between word lines and word-line driving circuits in a prior art semiconductor device.
Figure 2:
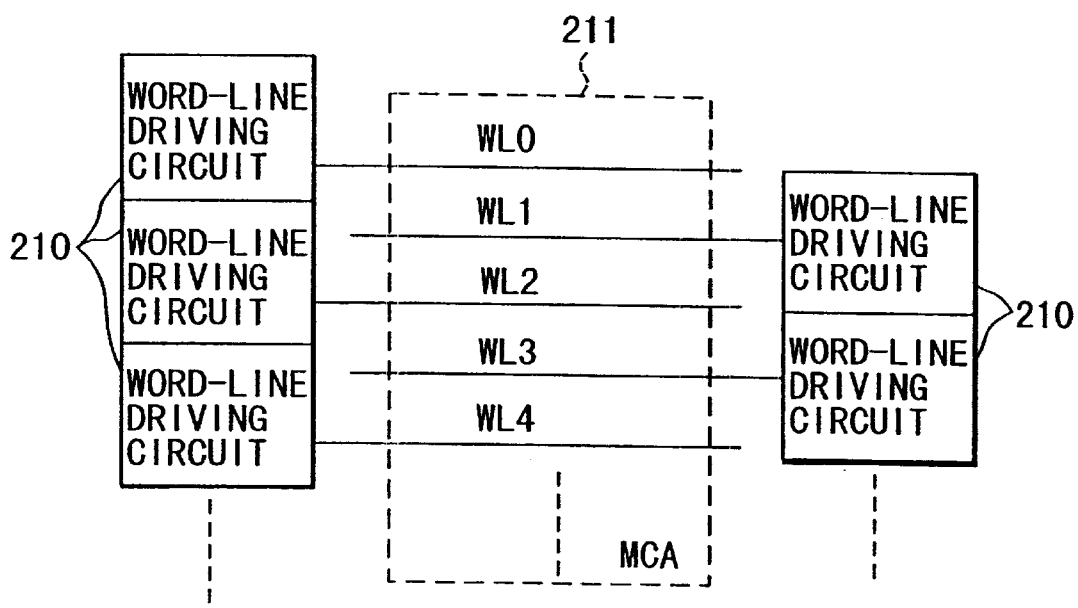
FIG. 2 is a second schematic block diagram showing a relationship between word lines and word-line driving circuits in a prior art semiconductor device.
Figure 3:
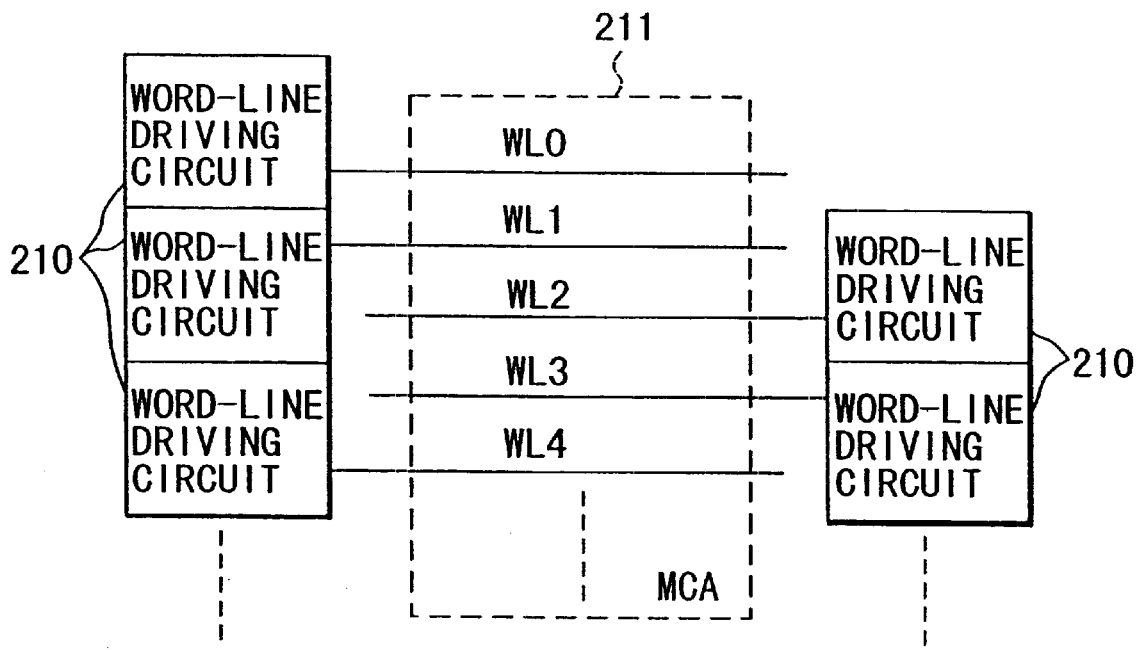
FIG. 3 is a third schematic block diagram showing a relationship between word lines and word-line driving circuits in a prior art semiconductor device.
Figure 4:
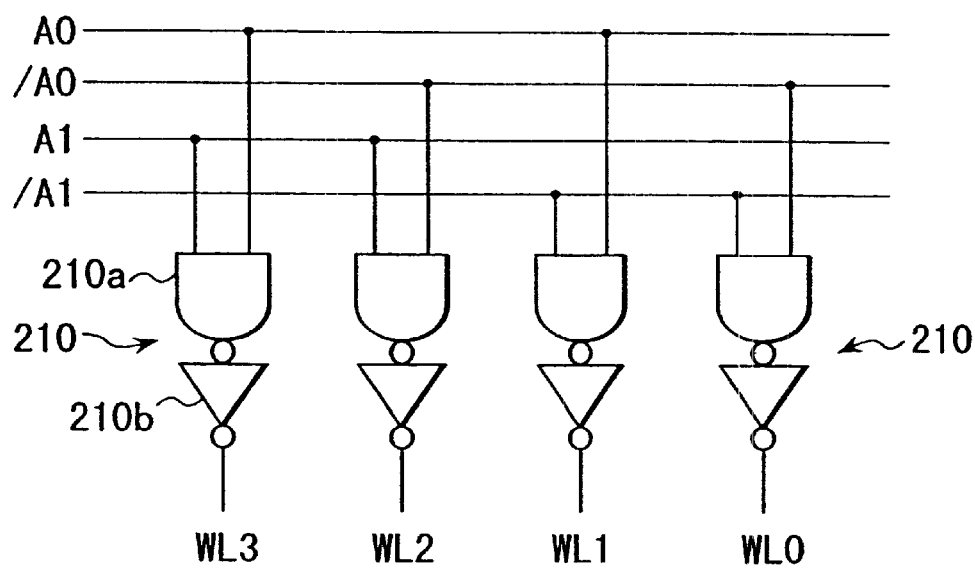
FIG. 4 is a circuit diagram showing prior art word-line decoders.
Figure 5:
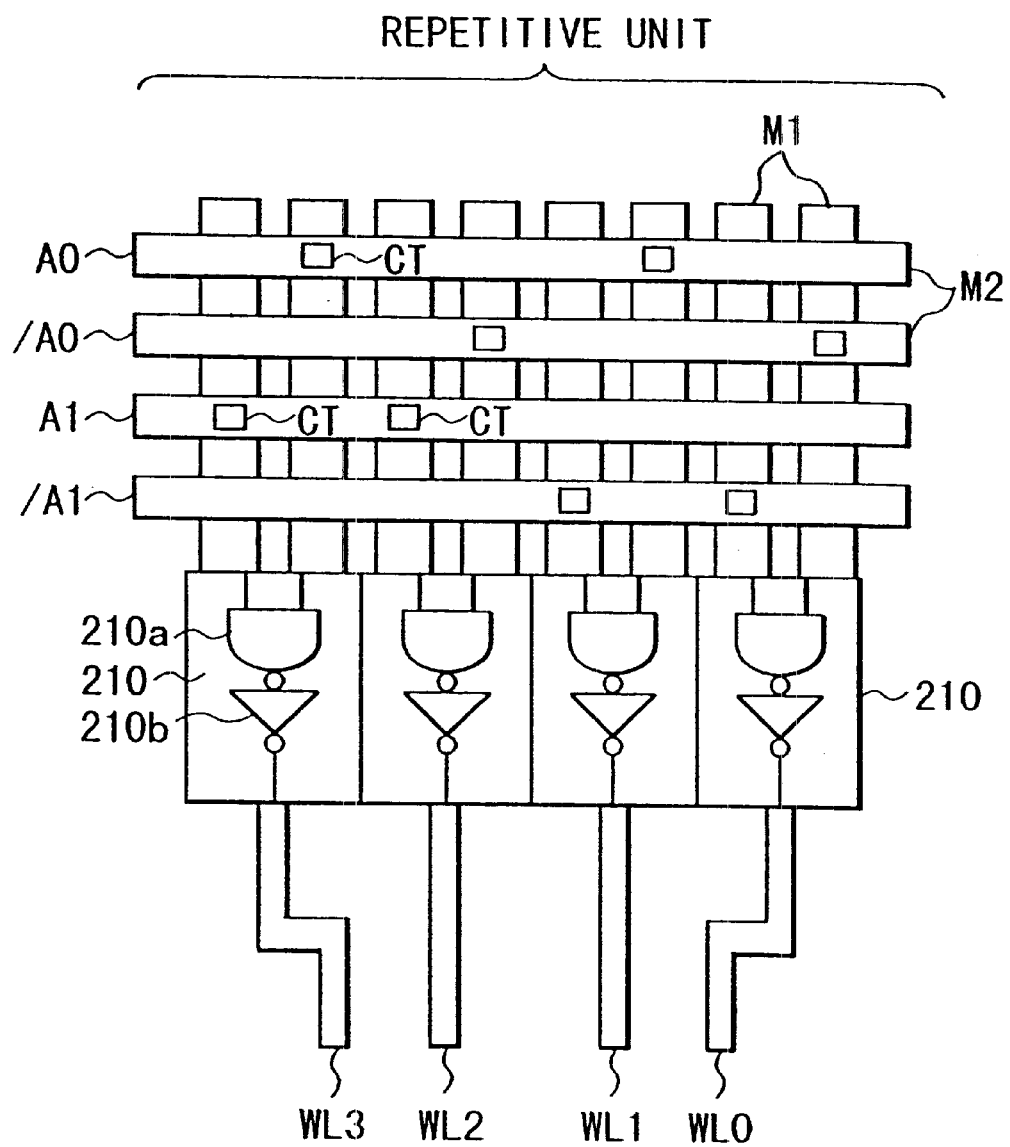
FIG. 5 is a schematic circuit diagram showing prior art word-line decoders.
Figure 6:
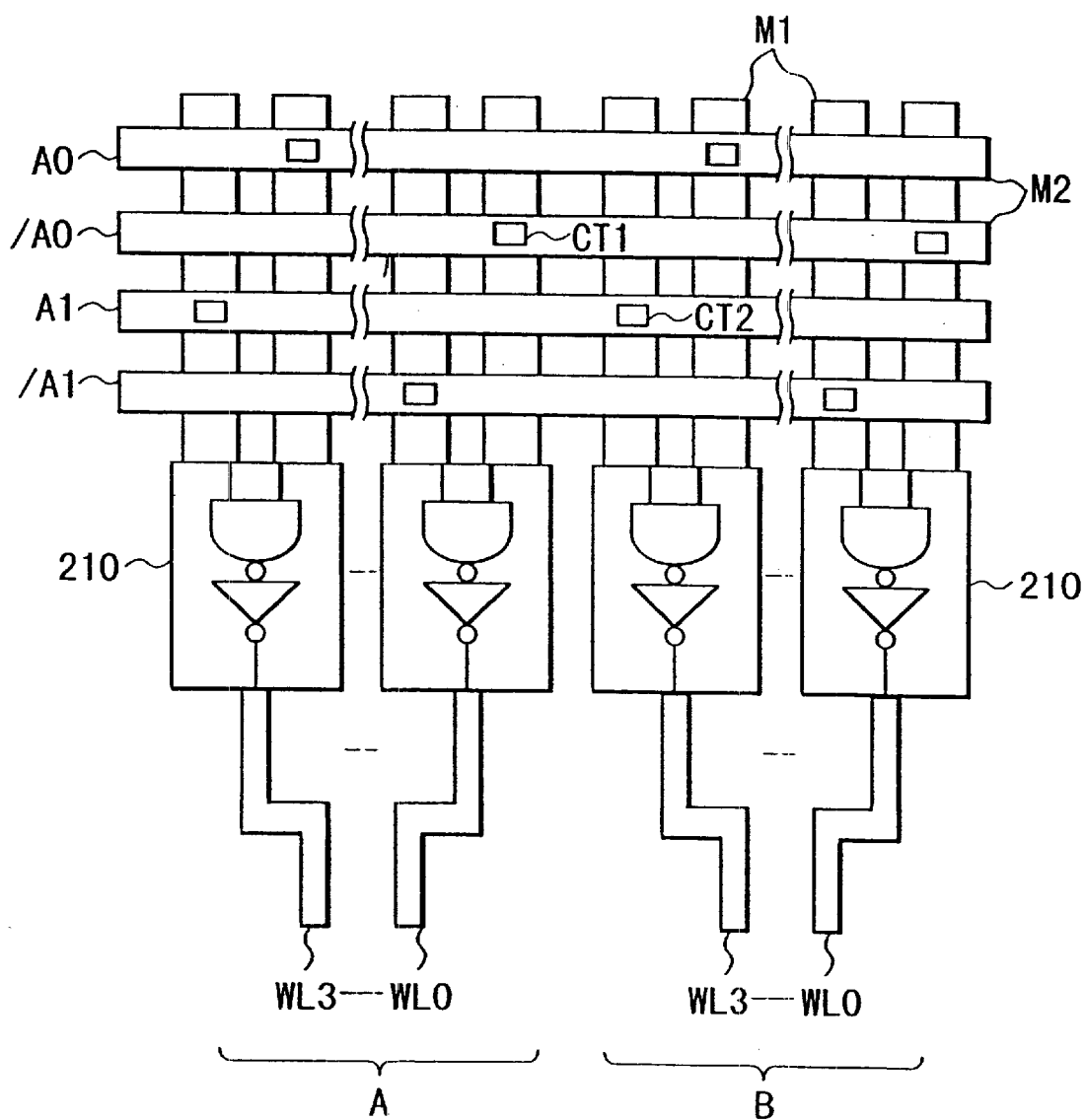
FIG. 6 is a schematic circuit diagram of prior art word-line decoders arranged adjacent to each other.
Figure 7:
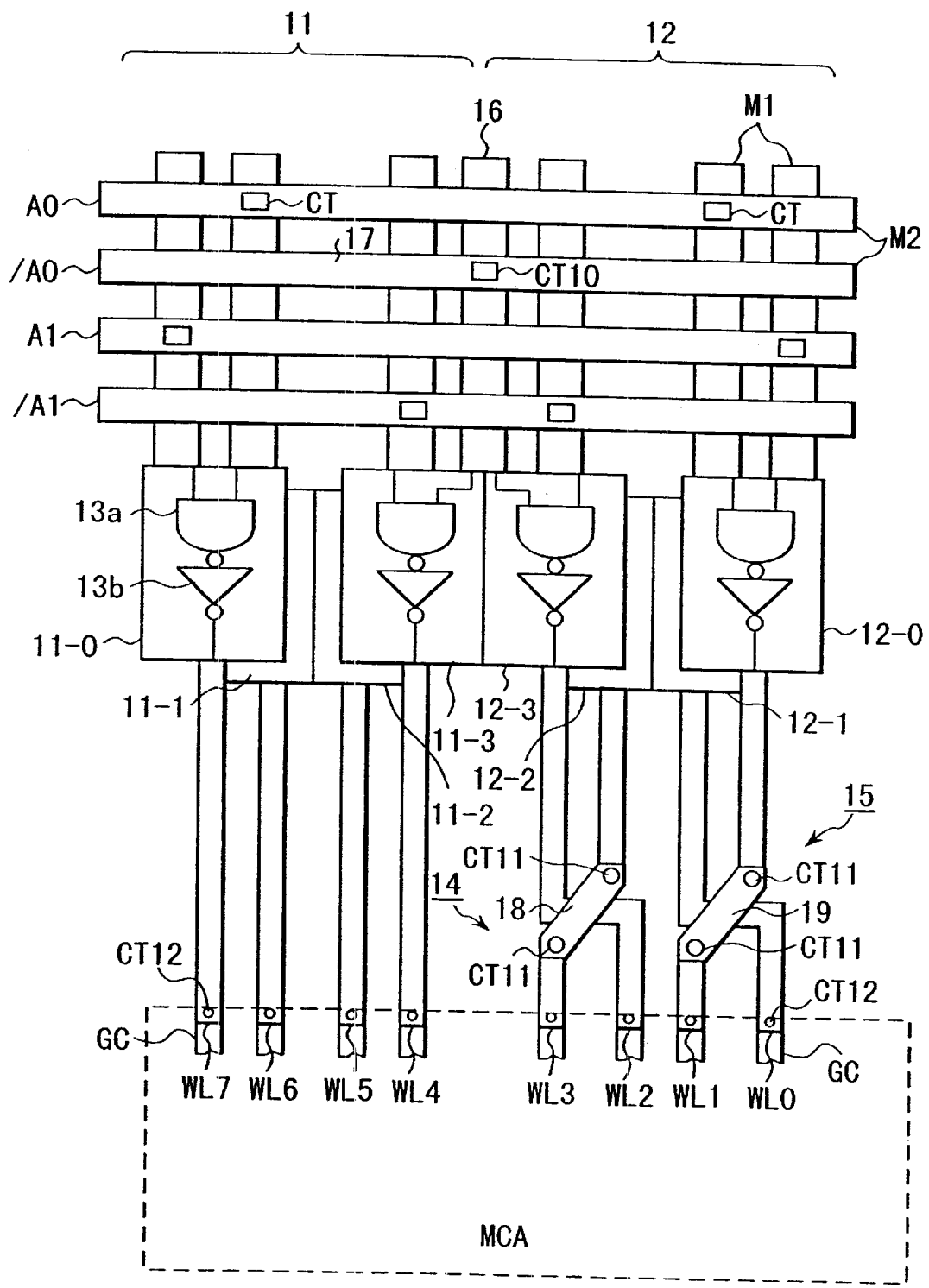
FIG. 7 is a schematic circuit diagram of a semiconductor device according to a first embodiment of the present invention in which output terminals of word-line decoders are connected to word lines so as to cross each other.

FIGS. 7 and 8 show a DRAM according to a first embodiment of the present invention. In this embodiment, word-line decoders are arranged on only one side of a memory cell array.

Referring to FIG. 8, a relationship between address assignment of the word-line decoders and repetitive units will be described first. When word lines are selected by address signals (low-order four bits of an input address) A0 to A3, a repetitive unit can be constituted of two word lines selected by the address signal (low-order one bit) A0, four word lines selected by the address signals (low-order two bits) A1 and A0, and eight word lines selected by the address signals (low-order three bits) A2, A1 and A0. In the first embodiment, a repetitive unit on the layout, which is constituted of four word lines selected by the address signals A1 and A0, will be described as one example.

FIG. 7 illustrate first and second repetitive units 11 and 12. These repetitive units each include four word lines (WL7 to WL4; WL3 to W10) as one repetitive unit. The first repetitive unit 11 has four word-line decoders 11-0 to 11-3, while the second repetitive unit 12 includes four word-line decoders 12-0 to 12-3. Each of the word-line decoders is constituted of a NAND circuit (first logic circuit) 13a and an inverter circuit (second logic circuit) 13b. The first and second repetitive units 11 and 12 also include a plurality of input wires of first metal wiring layers M1 connected to the input terminals of the NAND circuits 13a, a plurality of address wires of second metal wiring layers M2 formed above the first metal wiring layers M1 and supplied with address signals A0, /A0, A1 and /A1 (/ indicates an inverted signal), and a plurality of contacts CT for connecting the first and second metal wiring layers M1 and M2 in required positions.

In the first embodiment, the adjacent first and second repetitive units 11 and 12 are symmetrical with respect to a boundary region therebetween. More specifically, both a wire 16 of first metal wiring layer M1 and a contact CT10 for connecting the wire 16 to a wire 17 of second metal wiring layer M2 supplied with the address signal /A0, which are located on the boundary region, are common to the first and second repetitive units 11 and 12. The contacts CT of the first and second repetitive units 11 and 12 are thus arranged symmetrically with regard to the wire 16 and contact CT10.

In the first repetitive unit 11, the output terminals of the word-line decoders 11-0 to 11-3 are connected to their respective word lines WL7 to WL4. In the second repetitive unit 12, the output terminals of the word-line decoders 12-0 to 12-3 are connected to the word lines WL3 to WL0 so as to cross each other at intersections 14 and 15. In other words, the output terminal of the word-line decoder 12-0 is connected to the word line WL1 and that of the word-line decoder 12-1 is connected to the word line WL0. Furthermore, the output terminal of the word-line decoder 12-2 is connected to the word lines WL3, and that of the word-line decoder 12-3 is connected to the word line WL2.

Wires 18 and 19 are used for the above crossing connection. When the word lines are constituted of first metal wiring layers M1, the wires 18 and 19 are formed of second metal wiring layers M2 which differ from the first metal wiring layers M1. The second metal wiring layers M2 are each connected to the first metal wiring layers M1 by contacts CT11. In this example, the output terminals of the word-line decoders 12-0 to 12-3 and the word lines WL0 to WL3 are connected so as to cross each other, which is equivalent to the case where the output terminals of the word-line decoders 12-0 to 12-3 are connected so as to cross each other.

FIG. 7 shows only the two repetitive units 11 and 12. In actuality, however, a plurality of first repetitive units 11 including word-line decoders whose output terminals do not cross and a plurality of second repetitive units 12 including word-line decoders whose output terminals cross, are arranged alternately.

Furthermore, the word lines WL7 to WL0 are each connected to a GC (gate conductor) layer through a contact CT12. The GC layer underlies the first metal wiring layer M1, and a gate electrode is to be formed on the GC layer.

Figure 9:
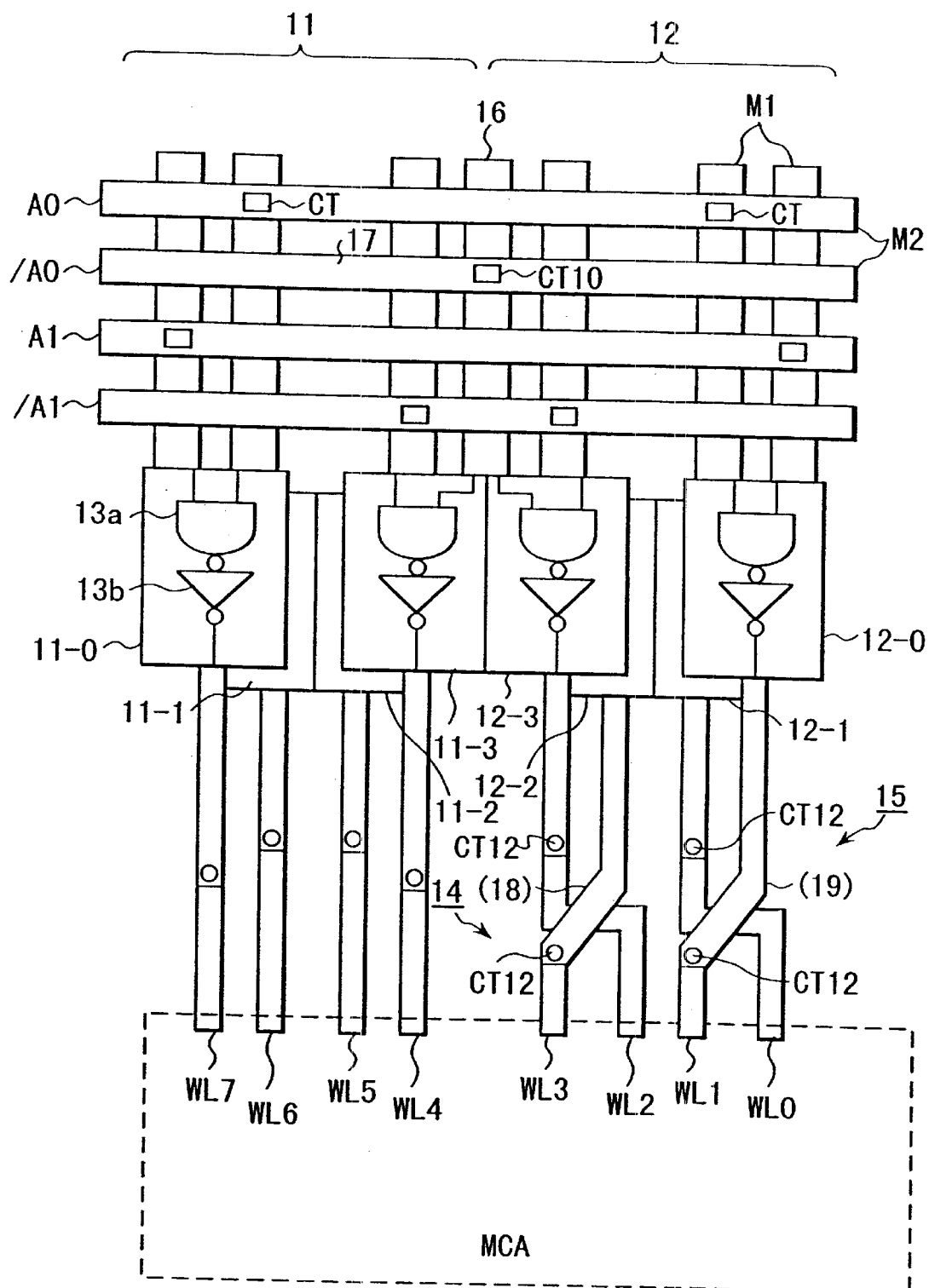
FIG. 9 is a schematic circuit diagram of another semiconductor device according to the first embodiment of the present invention in which output terminals of word-line decoders are connected to word lines so as to cross each other.

In FIG. 7, the wires 18 and 19 for the crossing connection are each formed of the second metal wiring layer M2 located above the first metal wiring layer, and the word lines WL7 to WL0 are each connected to the GC layer through the contact CT12. In contrast, as shown in FIG. 9, each of the wires 18 and 19 can be formed of the GC layer underlying the first metal wiring layer M1. In this figure, the output terminals of word-line decoders 11-0 to 11-3 and 12-0 to 12-3 are each formed of the first metal wiring layer M1, and word lines WL7 to WL0 are each formed of the GC layer. The first metal wiring layer M1 and GC layer are connected to each other through the contact CT12. If, as shown in FIG. 9, the first metal wiring layers M1 of which the output terminals of the word-line decoders 11-0 to 11-3 and 12-0 to 12-3 are formed, and the GC layers of which the word lines WL7 to WL0 are formed, cross each other, the second metal wiring layer M2 serving as the wires 18 and 19, shown in FIG. 7, need not be formed, or the contact CT11 is not required.

In the foregoing descriptions, the repetitive unit is constituted of four word lines. The present invention is not limited to this number. In general, it can be constituted of $2^n$ word lines, such as two word lines and eight word lines.

According to the above first embodiment, the first and second repetitive units 11 and 12 are symmetrical with each other, so that they have the wiring 16 and contact CT10 located on the boundary region in common. For this reason, the area for arraying the first and second repetitive units 11 and 12 can be reduced and so can be the chip area. The costs for manufacturing chips can be lowered accordingly.

In the first embodiment, the output terminals of the word-line decoders 12-0 to 12-3 and the word lines WL0 to WL3 of the second repetitive unit 12 are connected so as to cross each other. Therefore, even when the first and second repetitive units 11 and 12 are arranged symmetrically with each other, a given stress voltage can be applied between all adjacent word lines in a stress test for testing a dielectric strength between the word lines. Hereinafter the dielectric strength will be described.

The above DRAM is greatly decreased in size, as are the width of wires and the interval therebetween further. In particular, the word lines connected to the gate of a cell transistor have a minimum width and are arranged at minimum intervals. A boost potential Vpp (e.g., 4.5V), which is higher than an internal potential Vcc (e.g., 3.3V), is applied to the word lines, and its amplitude is so large as to fall within a range from ground potential Vss to boost potential Vpp. Thus, an insulator between a selected word line to which the boost potential is applied and its adjacent non-selected word line to which the ground potential Vss is applied, needs to have such a characteristic (dielectric strength) that it is not broken even though a voltage of (Vpp−Vss) is applied thereto.

DRAMs are submitted to a stress test in order to test a dielectric strength between word lines prior to shipment. In this stress test, a voltage of, e.g., 5.5V (stress voltage), which is higher than the boost potential Vpp in the normal operation mode, is applied to the word lines. They are left in this state for a long period of time, and a breakdown of their weak portions of the characteristic is accelerated. A defect portion caused by the stress test is compensated with the redundancy technique.

If the above stress test is conducted by the same access to a DRAM as in the normal use, only one is selected from among 512 word lines. If, therefore, the above stress is submitted to all the word lines, a very long period of test time is required. To shorten the test time, a DRAM includes a test mode in which an address of a word line is degenerated and, for example, one of two word lines is selected to allow a stress voltage to be applied between all adjacent word lines.

Since, in the foregoing test mode, a stress voltage can be applied between all adjacent word lines at once, the boost potential Vpp and ground potential Vss are applied alternately to adjacent word lines. Thus, a voltage of (Vpp−Vss) is applied between the adjacent word lines as a stress voltage.

Consider, in the above test mode, that the address signal A1 is degenerated and the address signals A1 and /A1 are both "1".

Figure 10A:
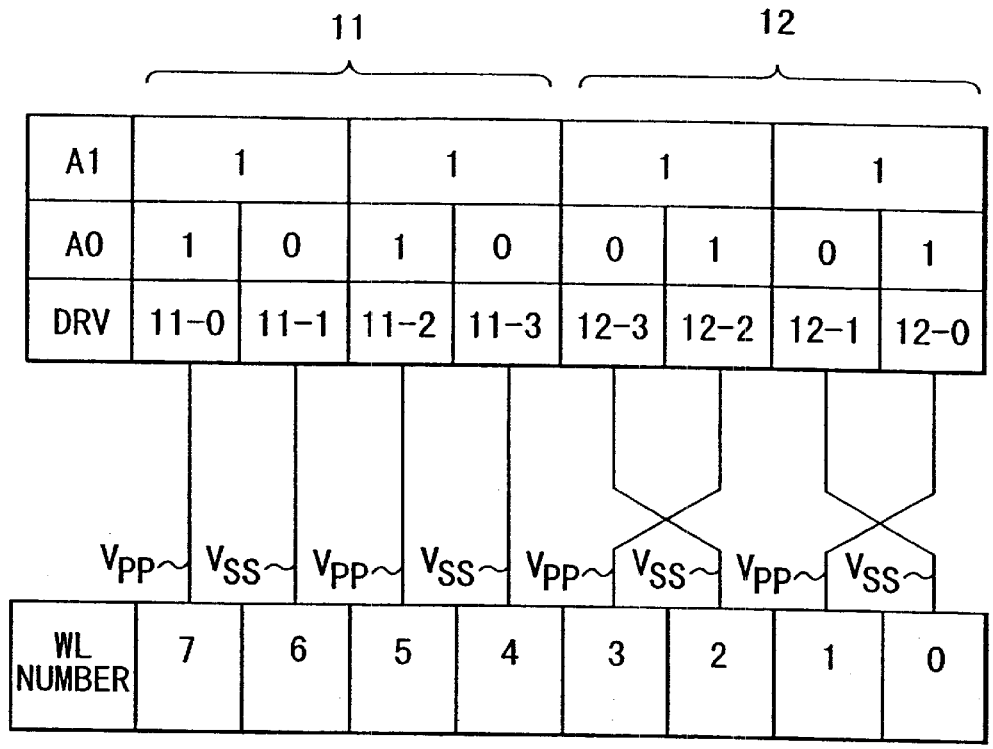
FIG. 10A is a schematic diagram showing a relationship between address signals and word-line potentials in a test mode.

FIG. 10A shows a relationship between address signals and word-line potentials in the DRAM according to the first embodiment of the present invention.

Assuming that the address signal A0 is equal to 1, the potentials of word lines WL7, WL5, WL3 and WL1 are set to Vpp and those of word lines WL6, WL4, WL2 and WL0 are set to Vss.

Assuming that the address signal A0 is equal to 0, the potentials of word lines WL6, WL4, WL2 and WL0 are set to Vpp and those of word lines WL7, WL5, WL3 and WL1 are set to Vss.

In both the cases, a stress voltage of Vpp to Vss can be applied between all adjacent word lines WL7 to WL0.

Figure 10B:
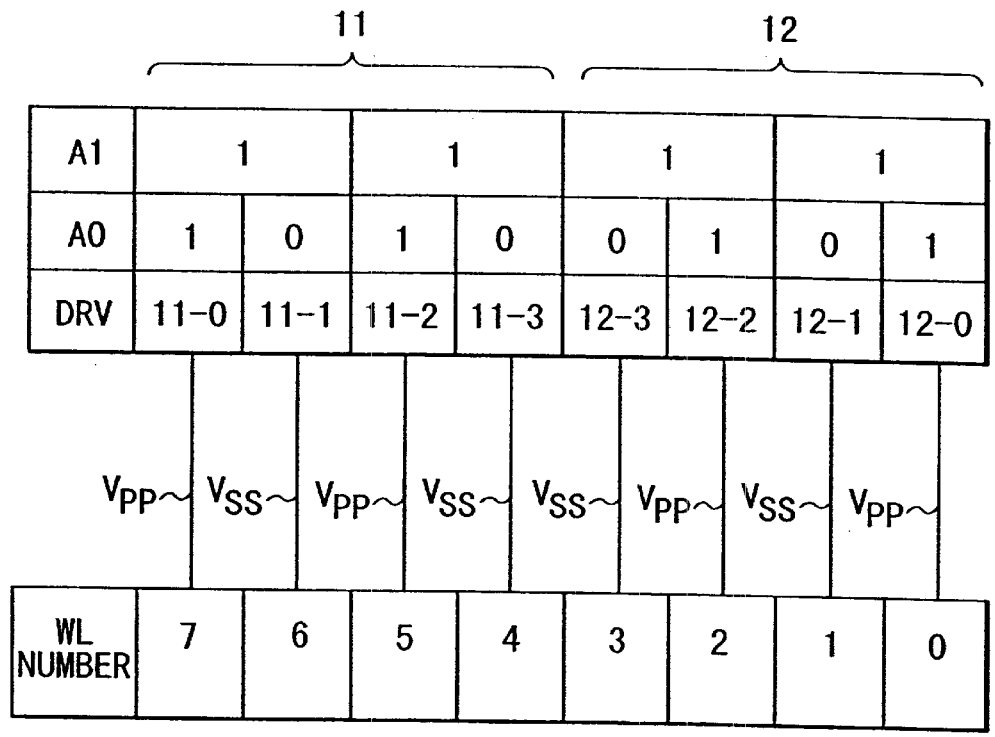
FIG. 10B is a schematic diagram showing another relationship between address signals and word-line potentials in the test mode, as contrasted with that shown in FIG. 10A.

As shown in FIG. 10B, however, adjacent word lines (WL4 and WL3) on the boundary region of the first and second repetitive units 11 and 12 are both set to ground potential Vss, and the stress voltage cannot be applied thereto correctly; even though the units 11 and 12 are simply arranged symmetrically with each other.

According to the first embodiment, the output terminals of the word-line decoders of one of the first and second repetitive units 11 and 12 are connected to the corresponding word lines so as to cross each other. Consequently, in the test mode, the stress voltage of (Vpp−Vss) can correctly be applied between all adjacent word lines.

Figure 11A:
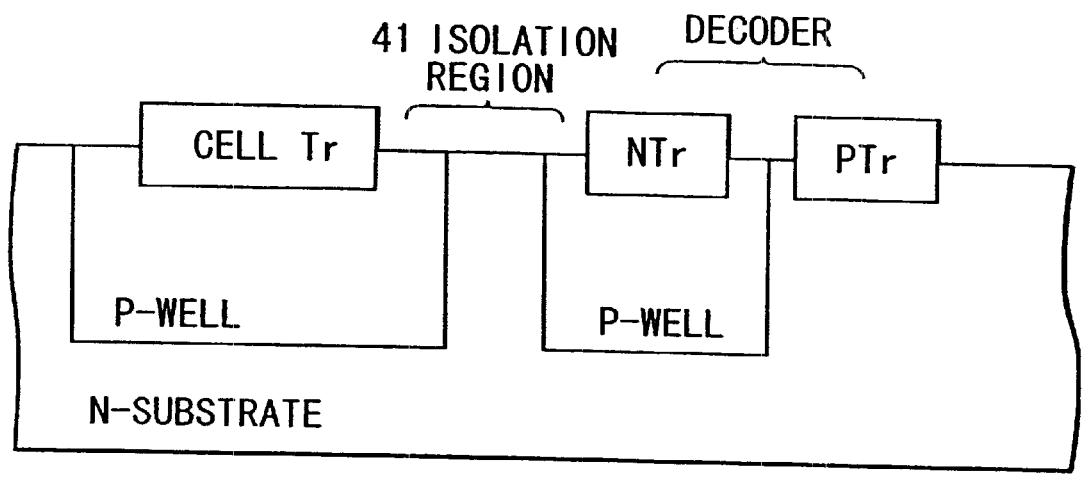
FIGS. 11A and 11B are schematic cross-sectional views of a DRAM for explaining a point at which the output terminal of a word-line decoder is connected to its corresponding word line so as to cross each other.
Figure 11B:
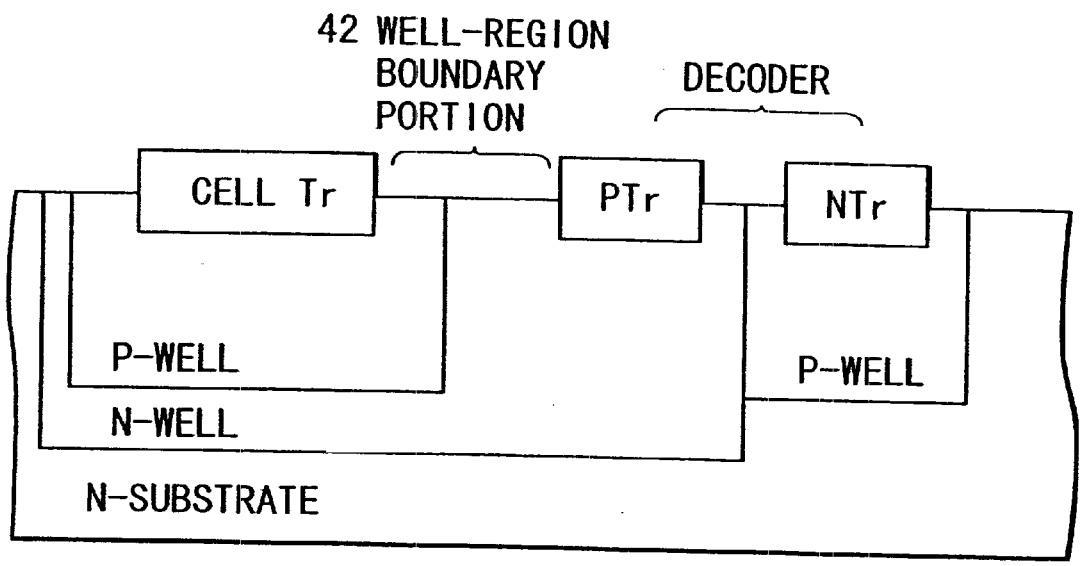

FIGS. 11A and 11B illustrate a normal DRAM in order to explain a point at which the output terminal of a word-line decoder is connected to its corresponding word line so as to cross each other.

In the DRAM shown in FIG. 11A, a peripheral circuit such as a decoder and a memory cell array differ from each other in back-gate bias potential. When an N-channel transistor is used as a cell transistor (CELL Tr), its back-gate bias potential is, for example, −0.9V, and the back-gate bias potential Vss of an N-channel transistor (NTr) constituting the peripheral circuit is, for example, 0V. If the back-gate bias potentials of the same N-channel transistors are different, P-type well regions in which these N-channel transistors are formed are isolated from each other by means of an N-type isolation region 41.

As illustrated in FIG. 11B, there may be a case where an N-type well region is formed between P-type well regions and a P-channel transistor (PTr) is formed in the N-type well region. Even in this structure, however, the N-type well region remains between the P-channel transistor (PTr) and the P-type well region including a cell transistor (CELL Tr). In general, the well region is formed by implanting ions into a substrate and diffusing the ions. Therefore, a relatively broader well-region boundary portion 42, in which a MOS transistor whose impurity concentration is not uniform cannot be formed, exists between the P-channel transistor and cell transistor.

The substrate can be either an N type or a P type.

In the first embodiment, the wires 18 and 19 for connecting the output terminals of word-line decoders and their corresponding word lines so as to cross each other, are formed in the isolation region 41 shown in FIG. 11A and the well-region boundary portion 42 shown in FIG. 11B. Any additional region for these wires 18 and 19 is not needed and thus the chip can be prevented from increasing in size.

(Second Embodiment)

Figure 12:
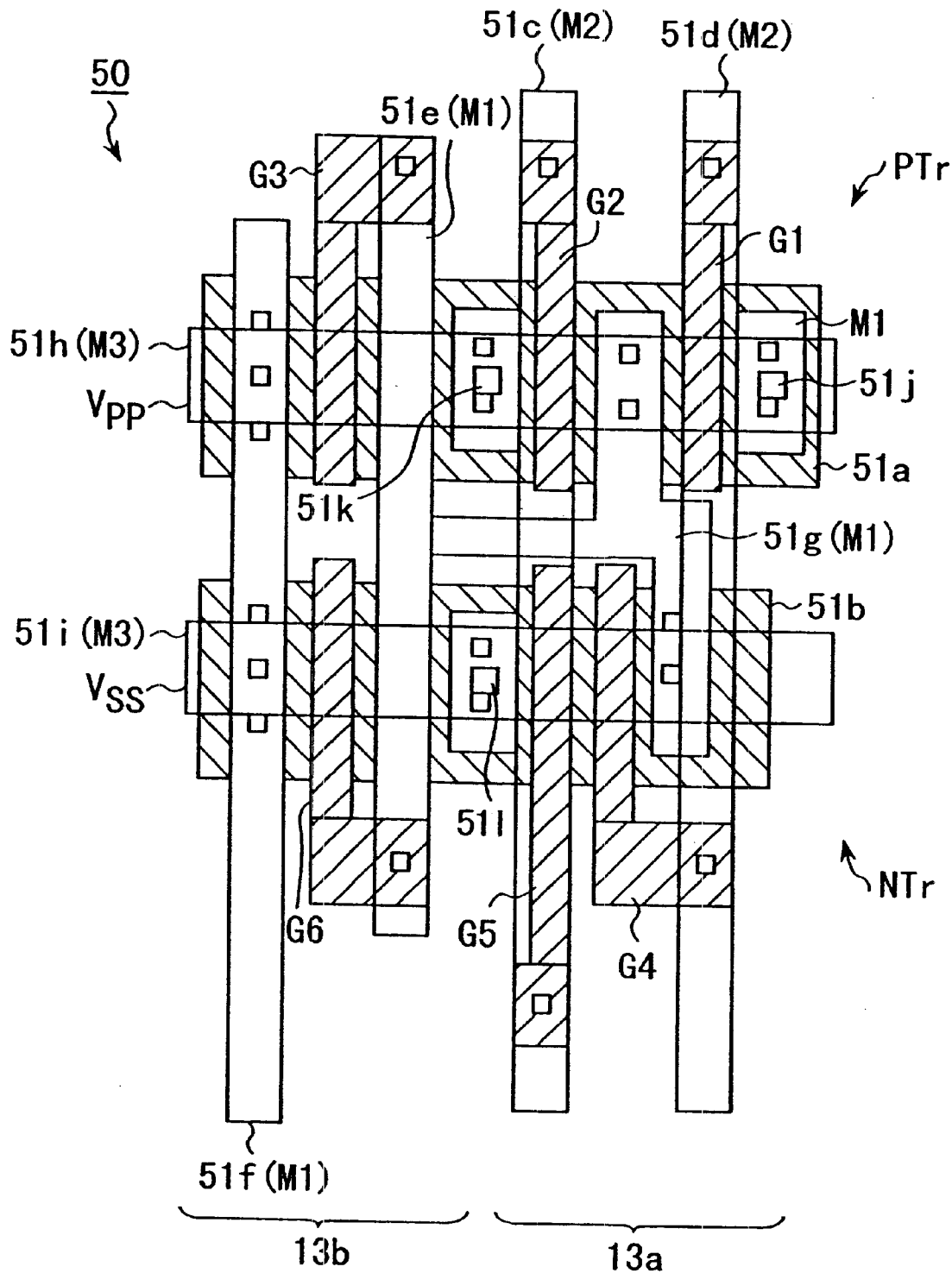
FIG. 12 is a schematic plan view showing a pattern layout of a word-line decoder.

A second embodiment of the present invention will now be described. According to the first embodiment, the output terminals of the word-line decoders and their corresponding word lines are connected to cross each other. The present invention is not limited to this. For example, the internal wires of adjacent word-line decoders can be connected to cross each other. Referring to FIG. 12, a basic structure of a word-line decoder will be described first.

A word-line decoder 50 shown in FIG. 12 has the same structure as that of each of the word-line decoders 11-0 to 11-3 and 12-0 to 12-3 shown in FIG. 7. In FIG. 12, the same structure elements as those in FIG. 7 denoted by the same reference numerals, and their detailed descriptions are omitted. In the word-line decoder 50, a plurality of gate electrode G1, G2 and G3 constituting a P-channel transistor PTr are formed on an N-type diffusion layer 51a. A plurality of gate electrodes G4, G5 and G6 constituting an N-channel transistor NTr are formed on a P-type diffusion layer 51b. In a NAND circuit 13a, an input terminal 51d of a second metal wiring layer M2 is connected to the gate electrodes G1 and G4, and an input terminal 51c of a second metal wiring layer M2 is connected to the gate electrodes G2 and G5. In an inverter circuit 13b, the gate electrodes G3 and G6 are connected to each other by a wire 51e of a first metal wiring layer M1, and an output terminal 51f of a first metal wiring layer M1 is connected to the N- and P-type diffusion layers 51a and 51b. The output terminal of the NAND circuit 13a and the input terminal of the inverter circuit 13b are connected to each other by a wire 51g of a first metal wiring layer M1. A power supply wire 51h of a third metal wiring layer M3 is formed on a region where the P-channel transistor PTr is to be formed, and a power supply wire 51i of a third metal wiring layer M3 is formed on a region where the N-channel transistor NTr is to be formed. A plurality of contacts 51j, 51k and 51l connect the power supply wires 51h and 51i to a first metal wiring layer M1 formed on the diffusion layers 51a and 51b.

Figure 13:
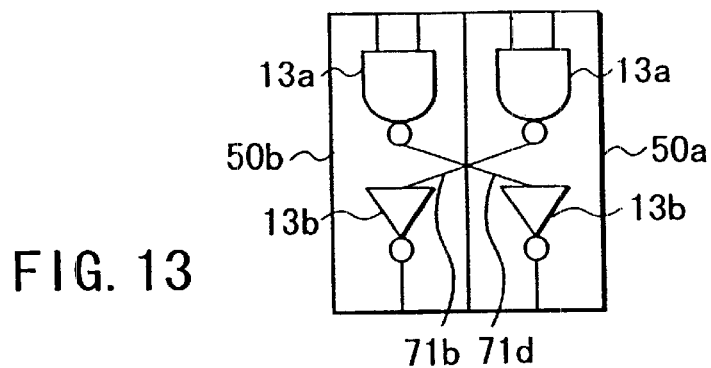
FIG. 13 is a schematic diagram of word-line decoders according to a second embodiment of the present invention in which the internal wires are connected to cross each other.
Figure 14:
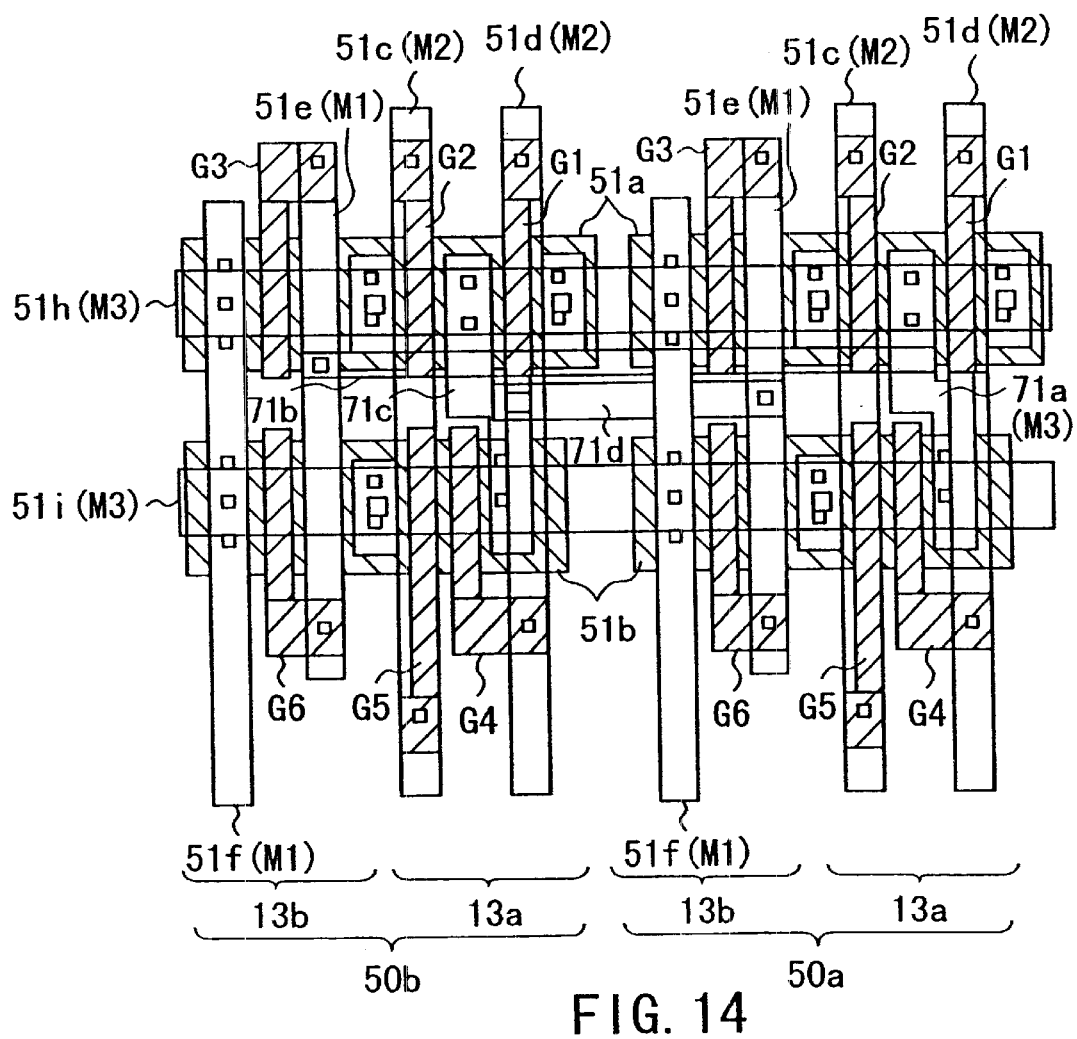
FIG. 14 is a schematic plan view showing a pattern layout of the word-line decoders of FIG. 13.

FIGS. 13 and 14 illustrate word-line decoders according to the second embodiment of the present invention. The second embodiment is directed to adjacent word-line decoders 50a and 50b having the same structure as shown in FIG. 12, and the internal wires of these word-line decoders are connected to cross each other.

As shown in FIG. 13, the output terminal of a NAND circuit 13a constituting the word-line decoder 50a is connected to the input terminal of an inverter circuit 13b constituting the word-line decoder 50b by means of a wire 71b, and the output terminal of a NAND circuit 13a constituting the word-line decoder 50b is connected to the input terminal of an inverter circuit 13b constituting the word-line decoder 50a by means of a wire 71d.

More specifically, as shown in FIG. 14, a wire 71a serving as the output terminal of the NAND circuit 13a constituting the word-line decoder 50a is connected to a wire 51e serving as the input terminal of the inverter circuit 13b constituting the word-line decoder 50b, by means of the wire 71b. A wire 71c serving as the output terminal of the NAND circuit 13a constituting the word-line decoder 50b is connected to a wire 51e serving as the input terminal of the inverter circuit 13b constituting the word-line decoder 50a, by means of the wire 71d. The wires 71a and 71b are each constituted of, e.g., a third metal wiring layer (M3).

According to the second embodiment described above, the internal wires of the adjacent word-line decoders 50a and 50b are connected to cross each other. Even in this second embodiment, when the first and second repetitive units are symmetrical with each other, a stress voltage can correctly be applied between all adjacent word lines in a test mode.

Moreover, when the output terminals of the word-line decoders and their corresponding word lines are connected to cross each other as in the first embodiment, no region is required for the crossing-connection outside the word-line decoders. An increase in chip size can thus be prevented further.

(Third Embodiment)

Figure 15:
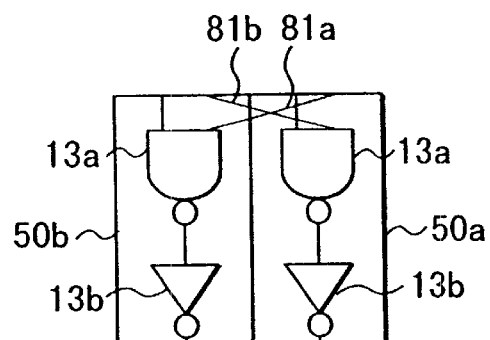
FIG. 15 is a schematic diagram of word-line decoders according to a third embodiment of the present invention in which their input terminals are connected to cross each other.
Figure 16:
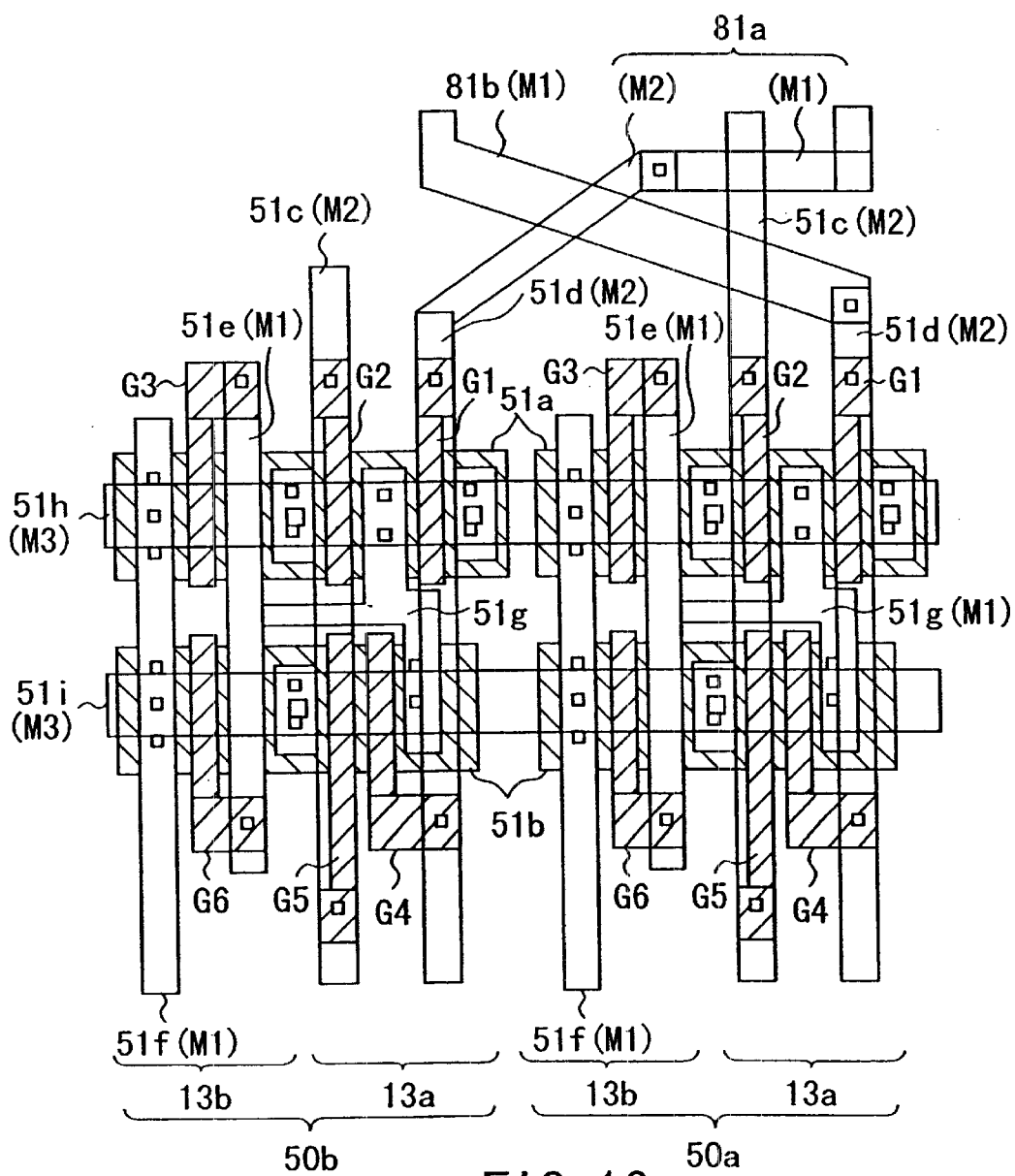
FIG. 16 is a schematic plan view showing a pattern layout of the word-line decoders of FIG. 15.

FIGS. 15 and 16 illustrate word-line decoders according to a third embodiment of the present invention. The third embodiment is directed to adjacent word-line decoders 50a and 50b whose input terminals are connected to cross each other.

Referring to FIG. 15, wires 81a and 81b cross each other and are each connected to one of input terminals of each of NAND circuits 13a constituting the word-line decoders 50a and 50b.

More specifically, as shown in FIG. 16, the wire 81b is connected to one of input terminals of the NAND circuit 13a constituting the word-line decoder 50a. The wire 81b is constituted of a first metal wiring layer M1. The wire 81a crosses the wire 81b and is connected to one of input terminals of the NAND circuit 13a constituting the word-line decoder 50b. The wire 81a is constituted by connecting first and second metal wiring layers M1 and M2.

Even in the third embodiment, a given stress voltage can correctly be applied between all adjacent word lines in a test mode. Furthermore, the input terminals of the adjacent word-line decoders are connected to cross each other and located away from a memory cell array. For this reason, there is room for wiring as compared with the first embodiment in which the output terminals of word line decoders and their corresponding word lines are connected to each other. Consequently, even though wiring is carried out for the connection, an additional region therefor need not be secured and thus a chip can be prevented from increasing in size.

(Fourth Embodiment)

Figure 17:
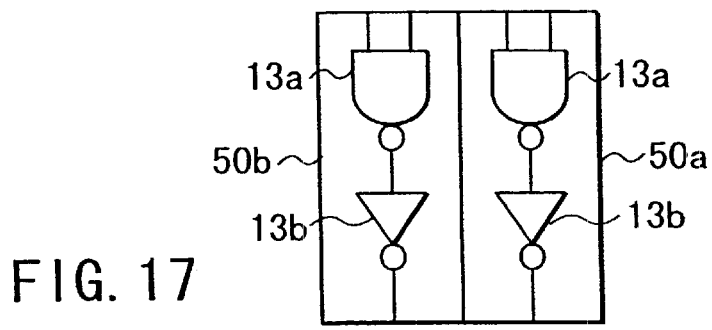
FIG. 17 is a schematic diagram of word-line decoders according to a fourth embodiment of the present invention which have a power supply wire and a contact in common.
Figure 18:
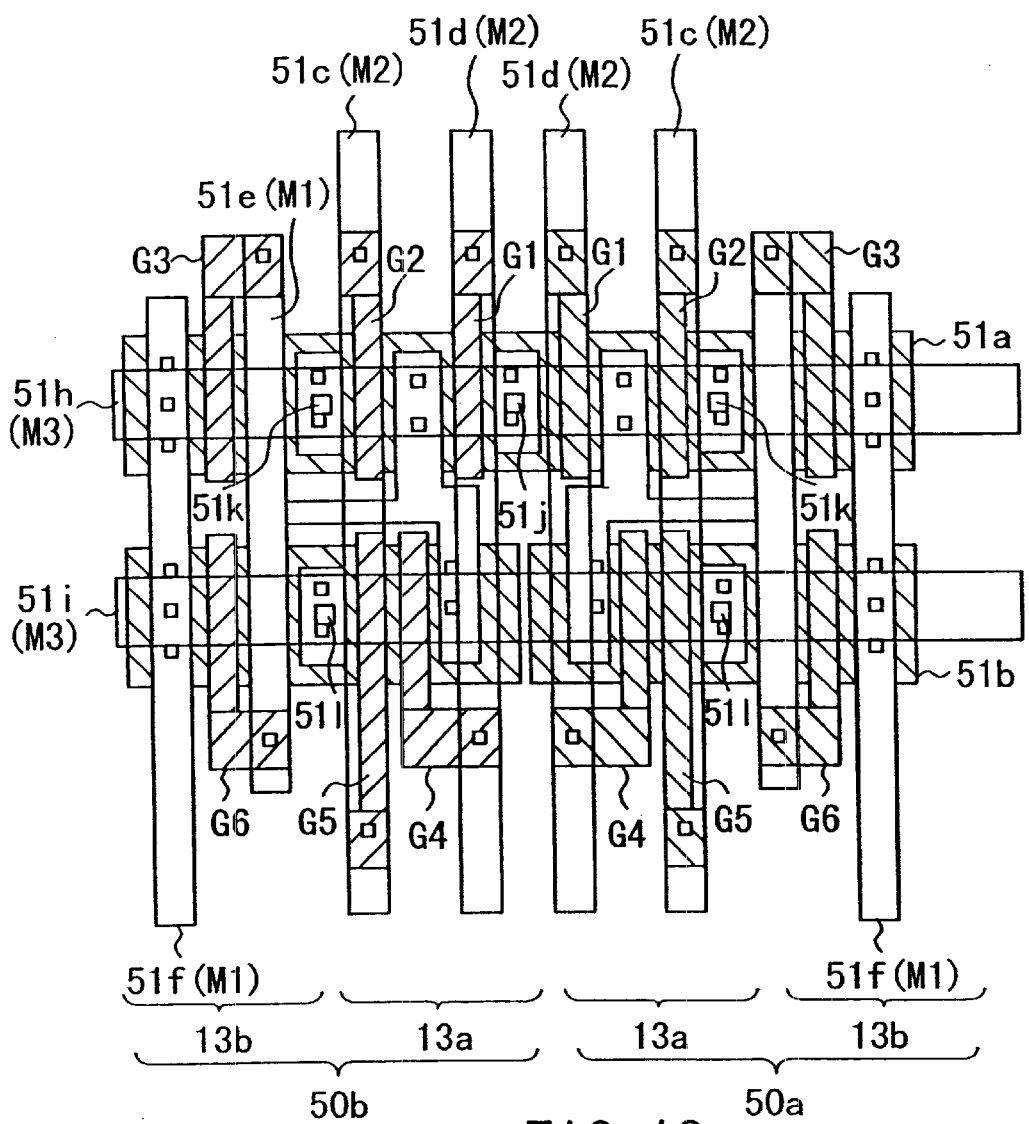
FIG. 18 is a schematic plan view showing a pattern layout of the word-line decoders of FIG. 17.

FIGS. 17 and 18 illustrate a fourth embodiment of the present invention. In the fourth embodiment, adjacent word-line decoders 50a and 50b have a power supply wire and a contact in common to decrease in area.

As shown in FIG. 17, the relationship between the word-line decoders 50a and 50b is the same as that in the first embodiment. The fourth embodiment can thus be applied to the first embodiment.

FIG. 18 shows a specific pattern of the word-line decoders 50a and 50b. These decoders have a power supply of a P-channel transistor in common. In other words, the word-line decoder 50a has the same pattern as shown in FIG. 12, and the word-line decoder 50b has a reversed pattern of that of FIG. 12. The word-line decoders 50a and 50b therefore have a diffusion layer 51a and a contact 51j, which are located on a boundary portion therebetween, in common. A power supply wire 51h can thus be connected to a first metal wiring layer M1 formed on the diffusion layer 51a by means of the contact 51j.

According to the fourth embodiment, the power supply wire and contact located on the boundary portion of adjacent word-line decoders are shared with the word-line decoders. The area of the word-line decoders can be reduced and the chip size can be decreased accordingly.

(Fifth Embodiment)

According to the above first to fourth embodiments, the word-line decoders are arranged only one side of the memory cell array. In contrast, according to a fifth embodiment, word-line decoders are arranged on both sides of a memory cell array, and the word-line decoders are connected alternately four by four.

Figure 19:
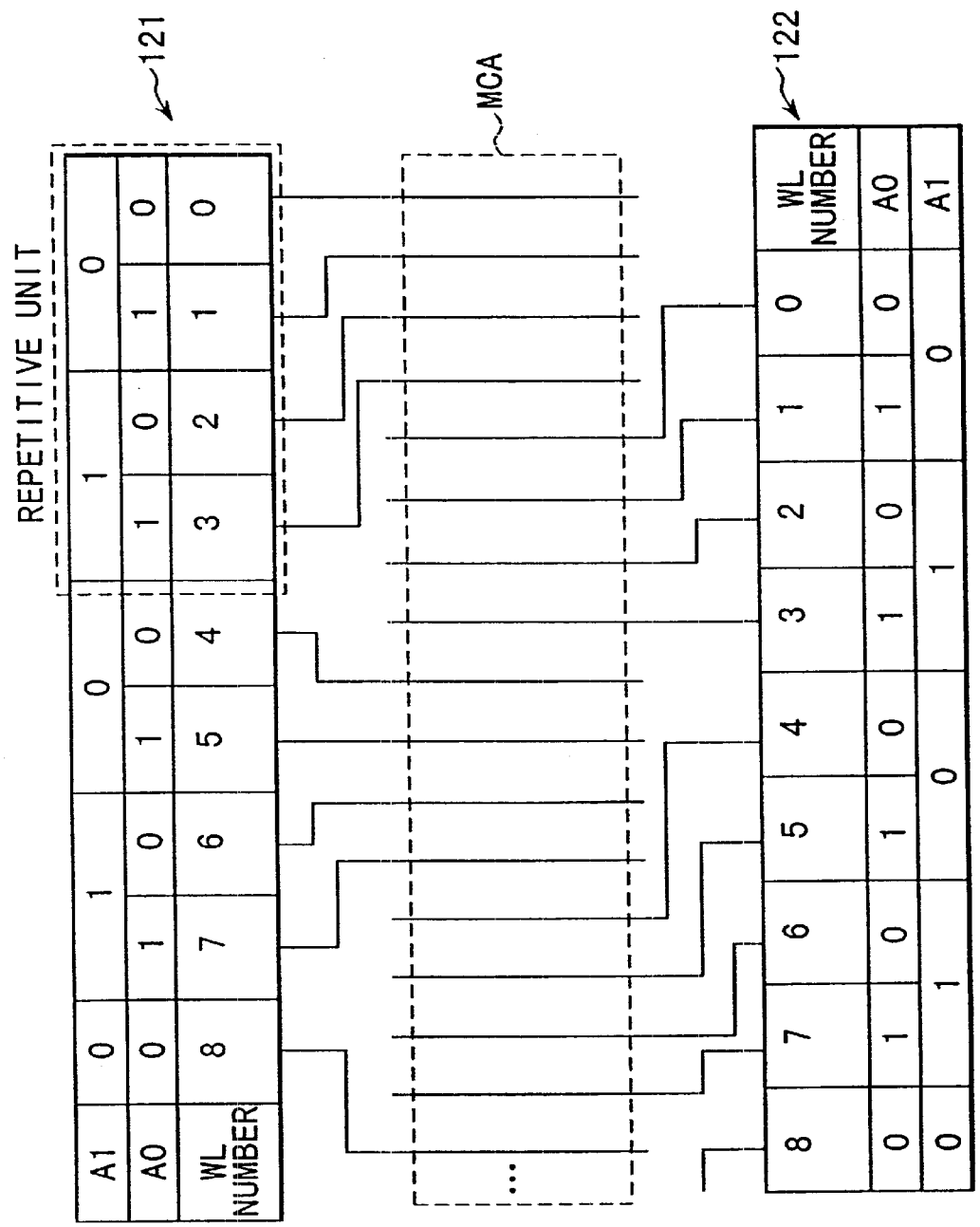
FIG. 19 is a schematic view showing an example of assignment for addresses of word-line decoders arranged on both sides of a memory cell array when the addresses are arranged in line.

FIG. 19 shows an example of assignment for address signals of the above word-line decoders when the address signals are arranged in line. Assume that address signals A0 and A1 of word-line decoders 121 and 122 arranged on both sides of a memory cell array MCA are assigned in line. If all the address signals A1 are degenerated into "1", address signals A0 are degenerated into "1", and address signals /A0 are degenerated into "0", a stress voltage of (Vpp–Vss) can be applied between all adjacent word lines. Since, however, the repetitive units of assignment for address signals are arranged not symmetrically but in line, the adjacent word-line decoders cannot have a contact or a wire in common.

Figure 20:
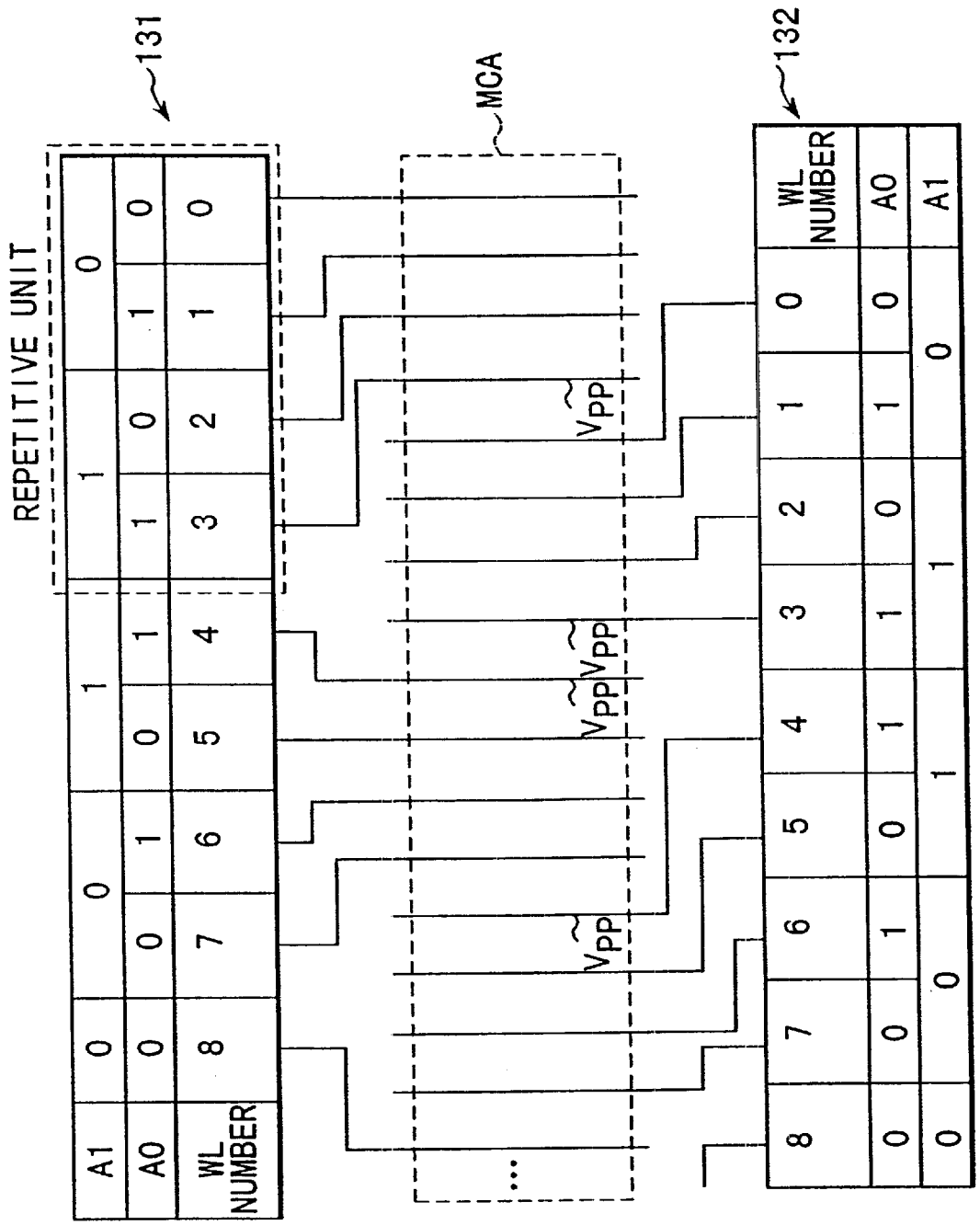
FIG. 20 is a schematic view showing an example of assignment for addresses of word-line decoders arranged on both sides of a memory cell array when the addresses are arranged symmetrically with each other.

FIG. 20 shows an example of assignment for address signals of the above word-line decoders when the address signals are arranged symmetrically with each other. For example, when address signals A0 and A1 of word-line decoders 131 and 132 arranged on both sides of the memory cell array MCA are assigned such that they are symmetrical with each other for every adjacent repetitive units, the repetitive units can have a contact and a wire, both of which are located on a boundary portion of the repetitive units, in common. If, however, in this example, the address signal A1 is degenerated to set the address signal A0 to "1" in the test mode, the potentials of the word lines WL4 and WL3 connected to the word-line decoders 131 and 132 are both set at Vpp. For this reason, a stress voltage of (Vpp+Vpp) is applied between the word line WL4 connected to the word-line decoder 131 and the word line WL3 connected to the word-line decoder 132, and a normal stress voltage cannot be applied.

In the fifth embodiment, therefore, the repetitive units of word-line decoders are inverted alternately for every adjacent two units, and the adjacent repetitive units are arranged symmetrically with each other, and an output terminal of the word-line decoder of one of the repetitive unit and its corresponding word line are connected so as to cross each other.

Figure 21:
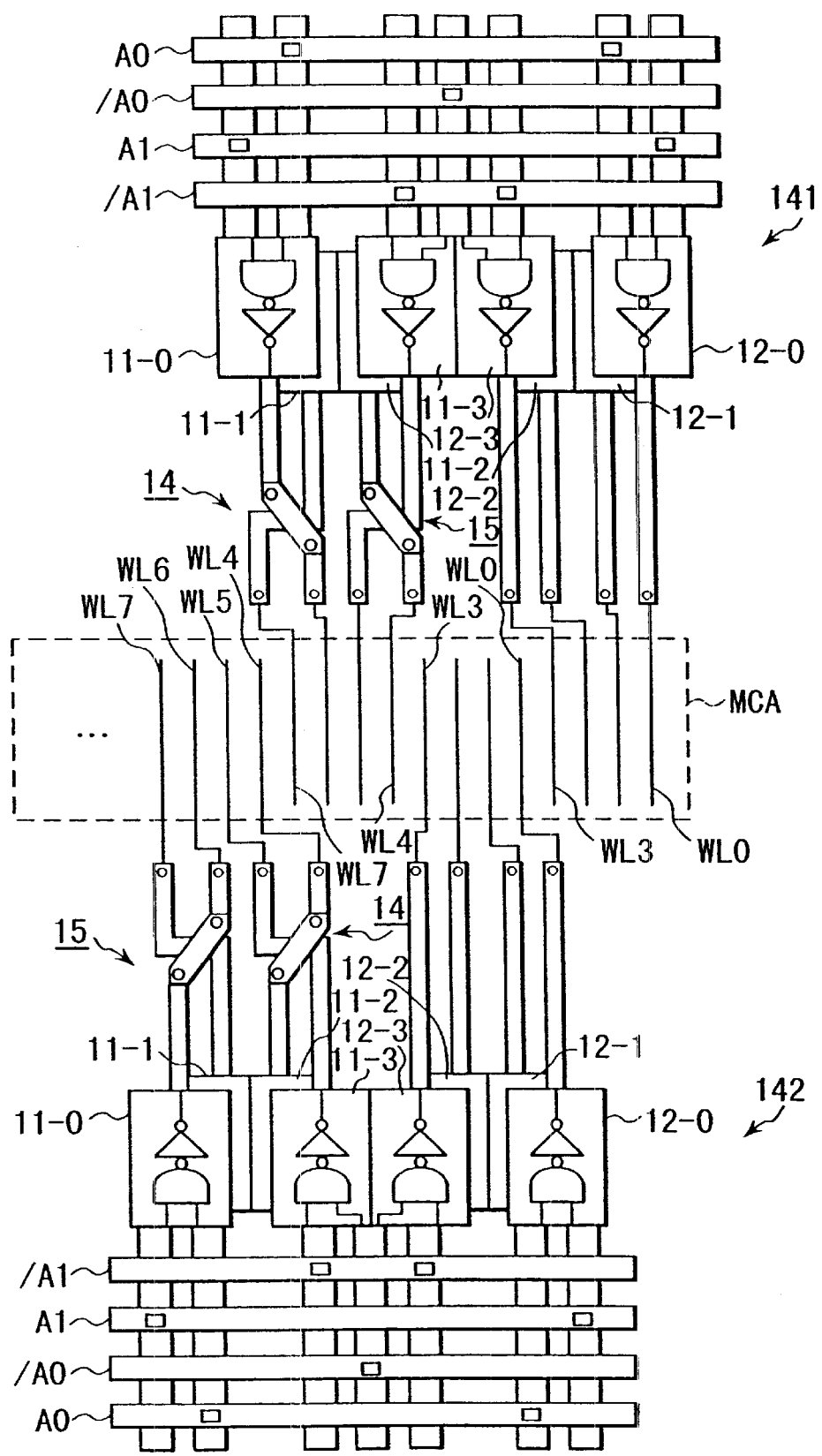
FIG. 21 is a schematic diagram of word-line decoders according to a fifth embodiment of the present invention in which the word-line decoders are arranged on both sides of a memory cell array and their output terminals are connected to their corresponding word lines so as to cross each other.
Figure 22:
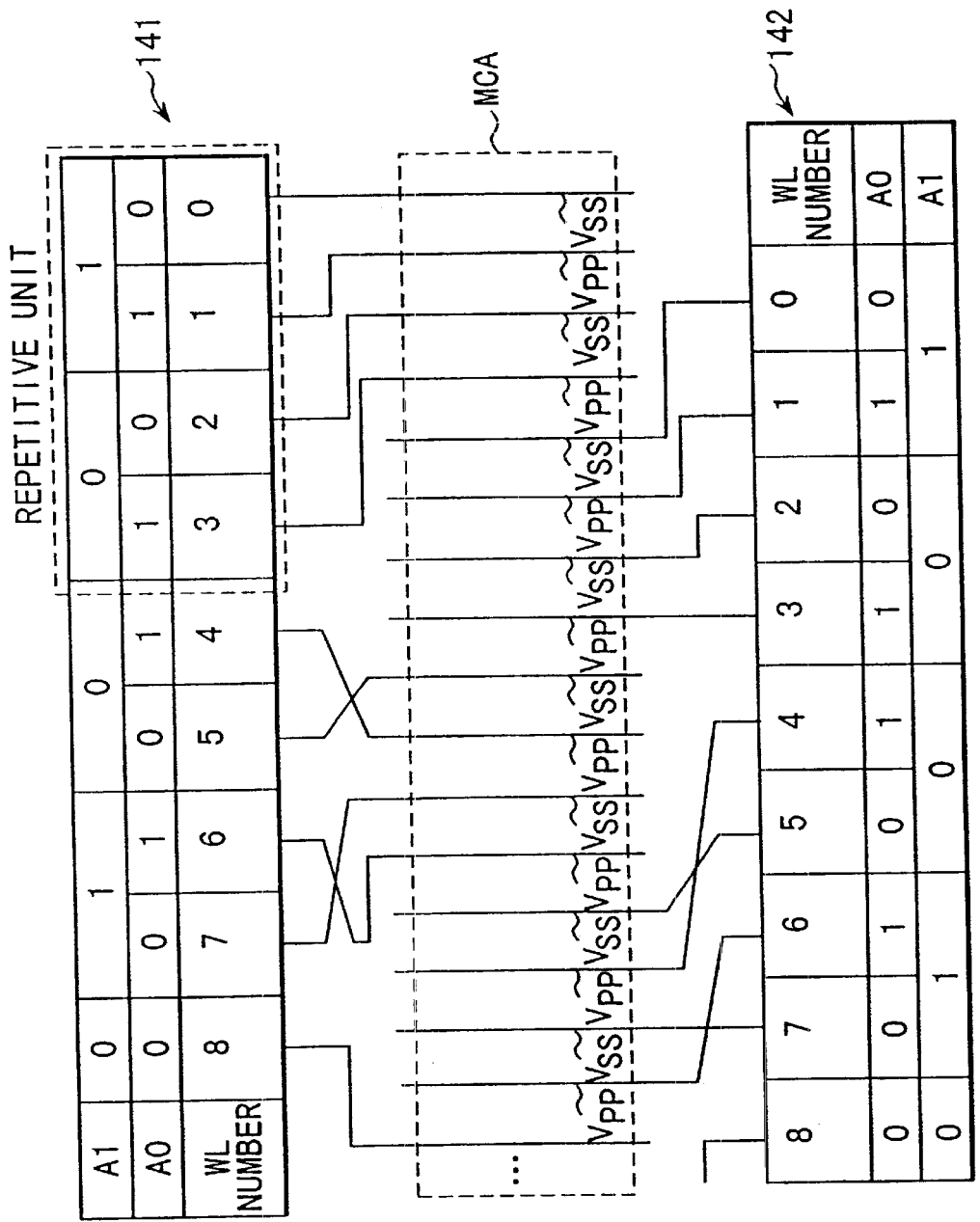
FIG. 22 is a schematic diagram showing an example of assignment for addresses of the word-line decoders of FIG. 21.

FIGS. 21 and 22 illustrate the fifth embodiment of the present invention. In this embodiment, address signals A0 and A1 of word-line decoders 141 and 142 arranged on both sides of a memory cell array MCA are assigned such that they are inverted and arranged symmetrically with each other for every adjacent repetitive units. For this reason, a contact with word lines WL4 and WL3 and a wire, which are located on a boundary portion of adjacent repetitive units, can be shared with the repetitive units. Further, an output terminal of the word-line decoder of one of the repetitive units is connected to its corresponding word line so as to cross each other. More specifically, as shown in FIG. 21, the word lines WL4 and WL5, which are connected to each of the word-line decoders 141 and 142, are connected to the output terminals of word-line decoders 11-2 and 11-3, respectively so as to cross each other, while the word lines WL6 and WL7 are connected to the output terminals of word-line decoders 11-0 and 11-1, respectively so as to cross each other.

According to the above fifth embodiment, since a plurality of adjacent repetitive units of each of the word-line decoders 141 and 142 are inverted alternately and arranged symmetrically with each other, a contact and a wire located on a boundary portion of adjacent repetitive units can be shared with the repetitive units. The chip size can thus be decreased. Since, moreover, the output terminal of each of the repetitive units in the word-line decoders 141 and 142 is connected to its corresponding word line so as to cross each other, a predetermined stress voltage can correctly be applied between all adjacent word lines in a test mode.

Figure 23:
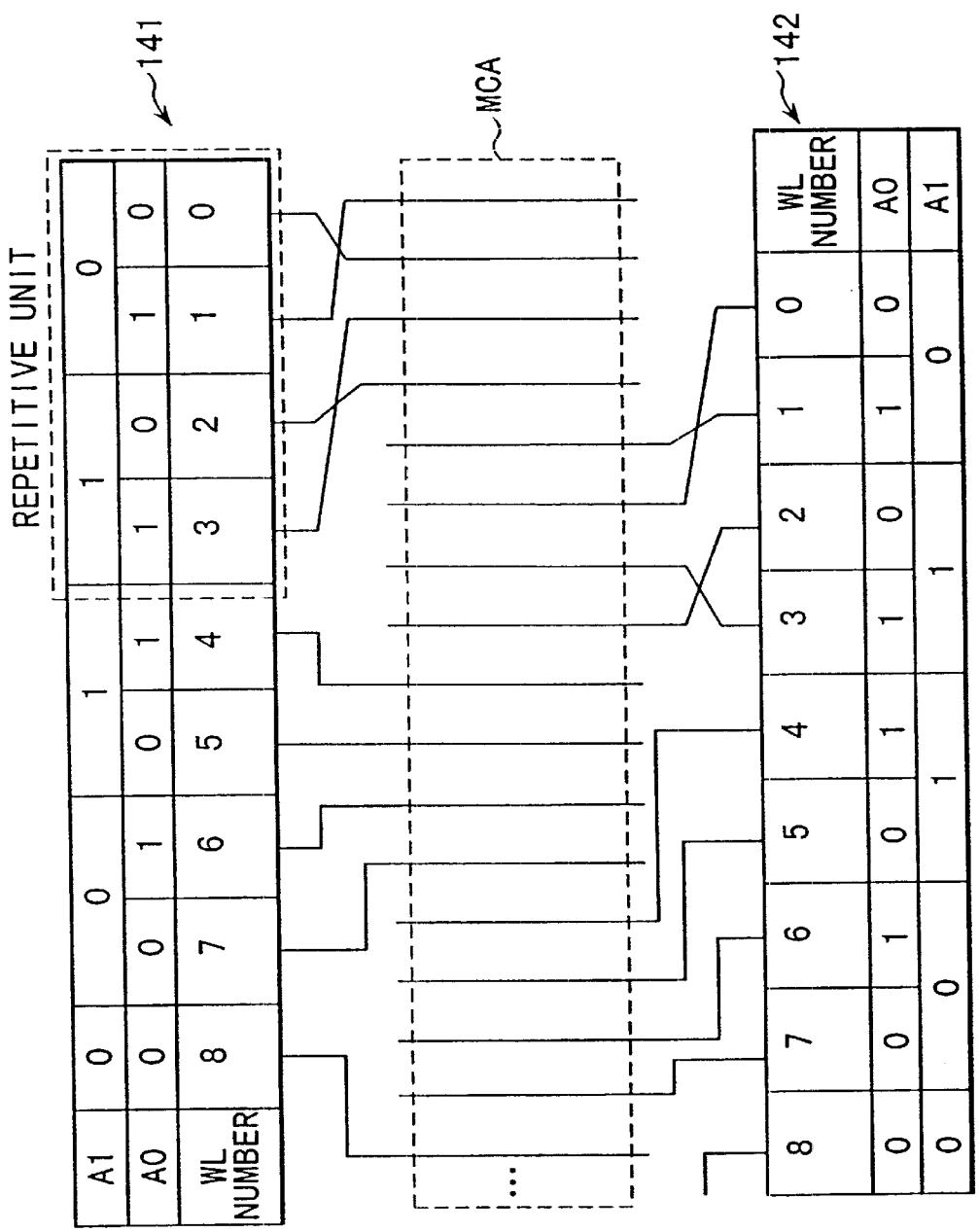
FIG. 23 is a schematic diagram of a modification to the example shown in FIG. 22.

FIG. 23 shows a modification to the address assignment of FIG. 22. In this modification, word lines WL0 and WL1 connected to the word-line decoder 141, cross each other, as do word lines WL2 and WL3 connected to the decoder 141. Further, word lines WL0 and WL1 connected to the word-line decoder 142, cross each other, as do word lines WL2 and WL3 connected to the decoder 142. With this arrangement, too, the same advantages as those of the fifth embodiment can be obtained.

In the foregoing fifth embodiment and its modification, the crossing word lines have the same number for both the word-line decoders 141 and 142. However, the present invention is not limited to this.

Moreover, the position in which the word lines cross each other is not limited between the output terminal of a word-line decoder and its corresponding word line.

Figure 24:
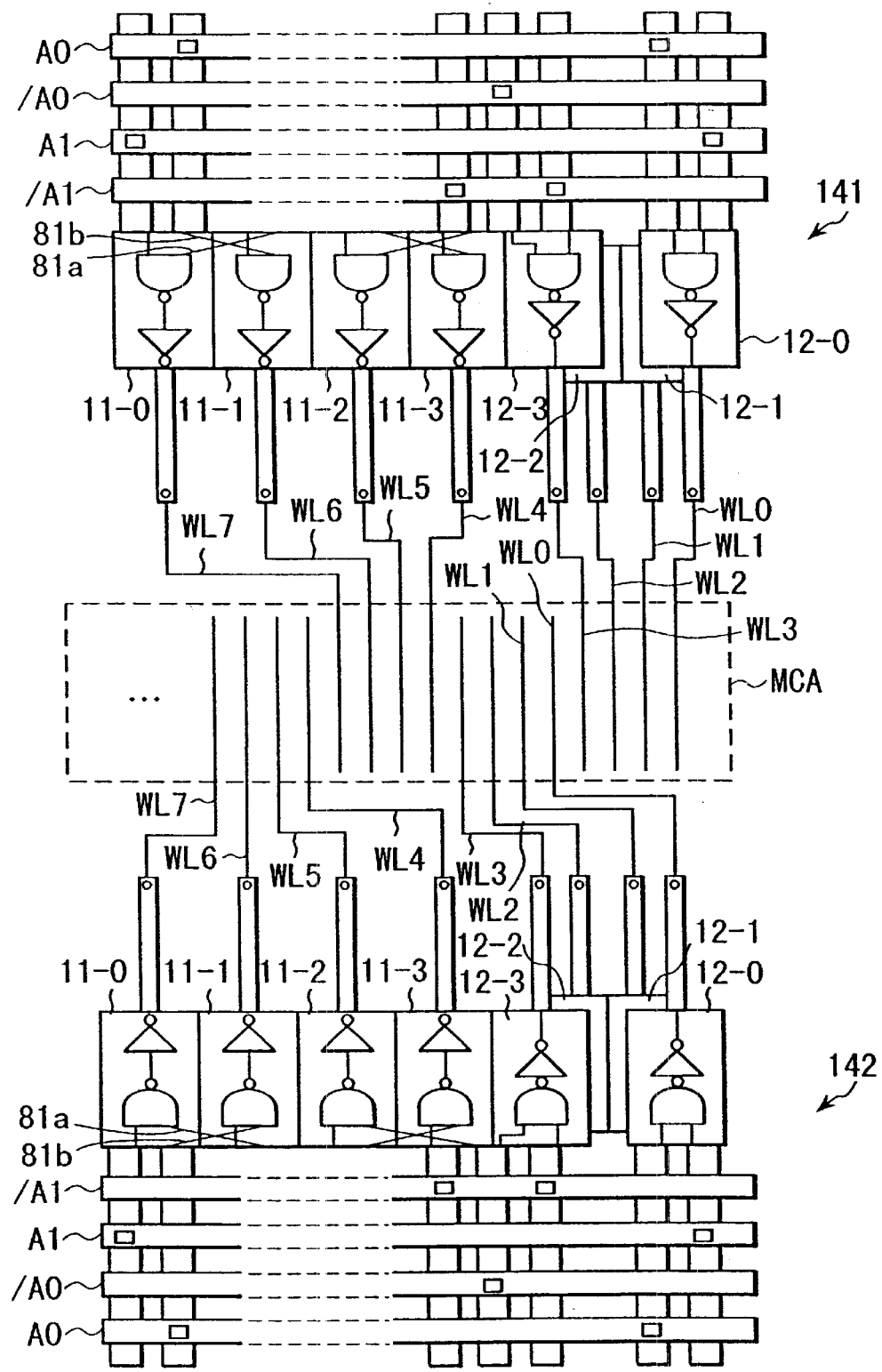
FIG. 24 is a schematic diagram of word-line decoders which are arranged on both sides of a memory cell array and whose internal wires are connected so as to cross each other.

FIG. 24 illustrates an example of word-line decoders corresponding to the second embodiment in which the internal wires of adjacent word-line decoders 11-0 to 11-3 (output terminals of NAND circuits and input terminals of inverter circuits) cross each other. In FIG. 24, the same elements as those of FIG. 21 are denoted by the same reference numerals.

Figure 25:
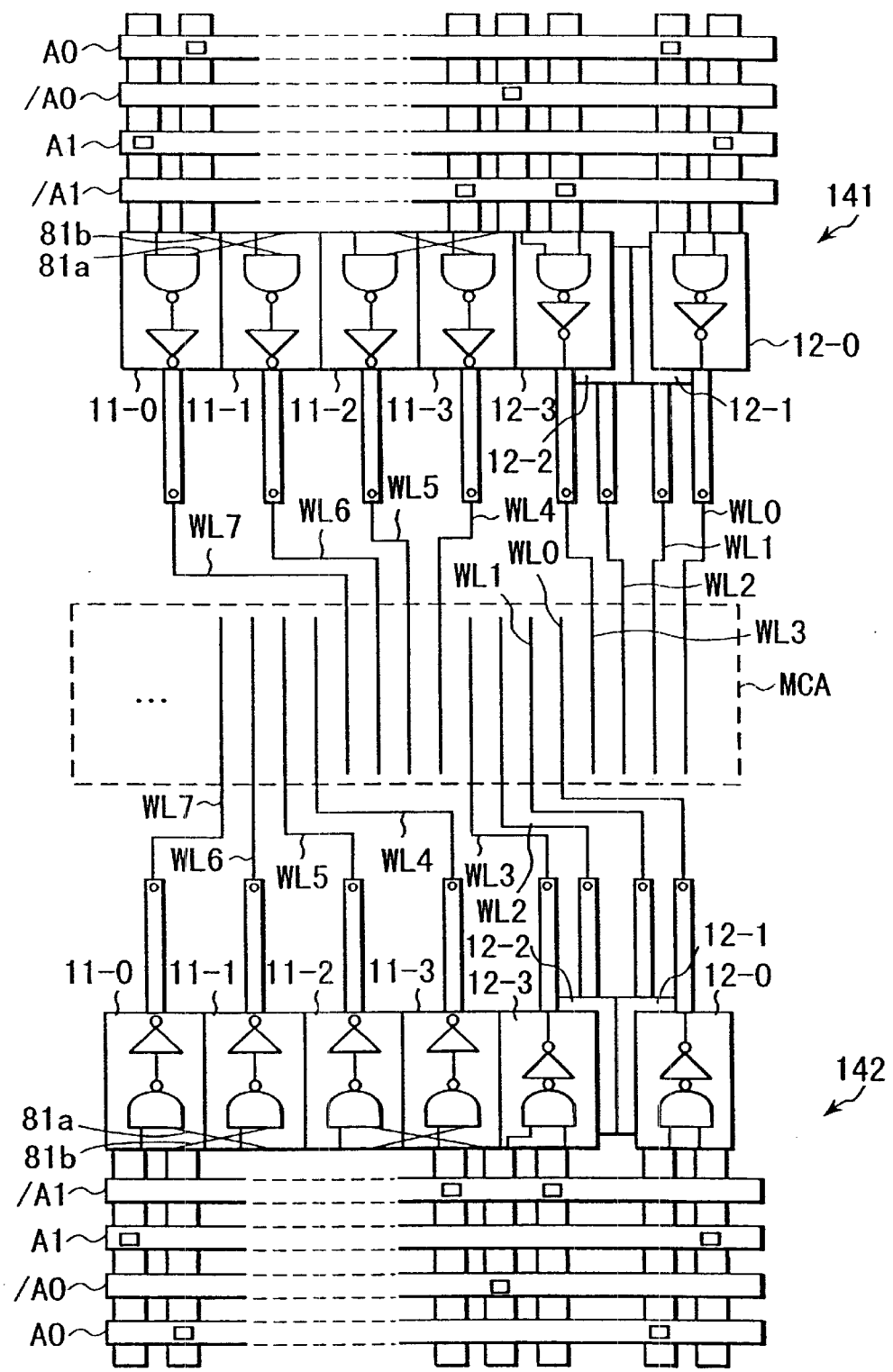
FIG. 25 is a schematic diagram of word-line decoders which are arranged on both sides of a memory cell array and whose input terminals are connected so as to cross each other.

FIG. 25 illustrates an example of word-line decoders corresponding to the third embodiment in which the input terminals of NAND circuits constituting word-line decoders cross each other. In FIG. 25, the same elements as those of FIG. 21 are denoted by the same reference numerals.

Furthermore, as in the fourth embodiment, a power supply wire and a contact can be shared with adjacent word-line decoders.

The number of word lines need not be limited to four, provided that it is an even number. Similarly, the number of repetitive units of word-line decoders need not be limited to the above number, provided that it is an even number.

(Sixth Embodiment)

In the foregoing fifth embodiment, the word-line decoders are arranged on both sides of a memory cell array. In the above first to fourth embodiments, the one-stage word-line decoders of one stage are arranged on only one side of a memory cell array. In contrast, according to a sixth embodiment of the present invention, the two-stage word-line decoders are arranged on one side of a memory cell array, the word-line decoders of each stage are connected alternately four by four.

In the sixth embodiment, the two-stage word-line decoders are arranged on one side of the memory cell array, and adjacent repetitive units of word-line decoders in each stage are inverted alternately and arranged symmetrically with each other, and an output terminal of a word-line decoder of each of the repetitive units is connected so as to cross its corresponding word line.

Figure 26:
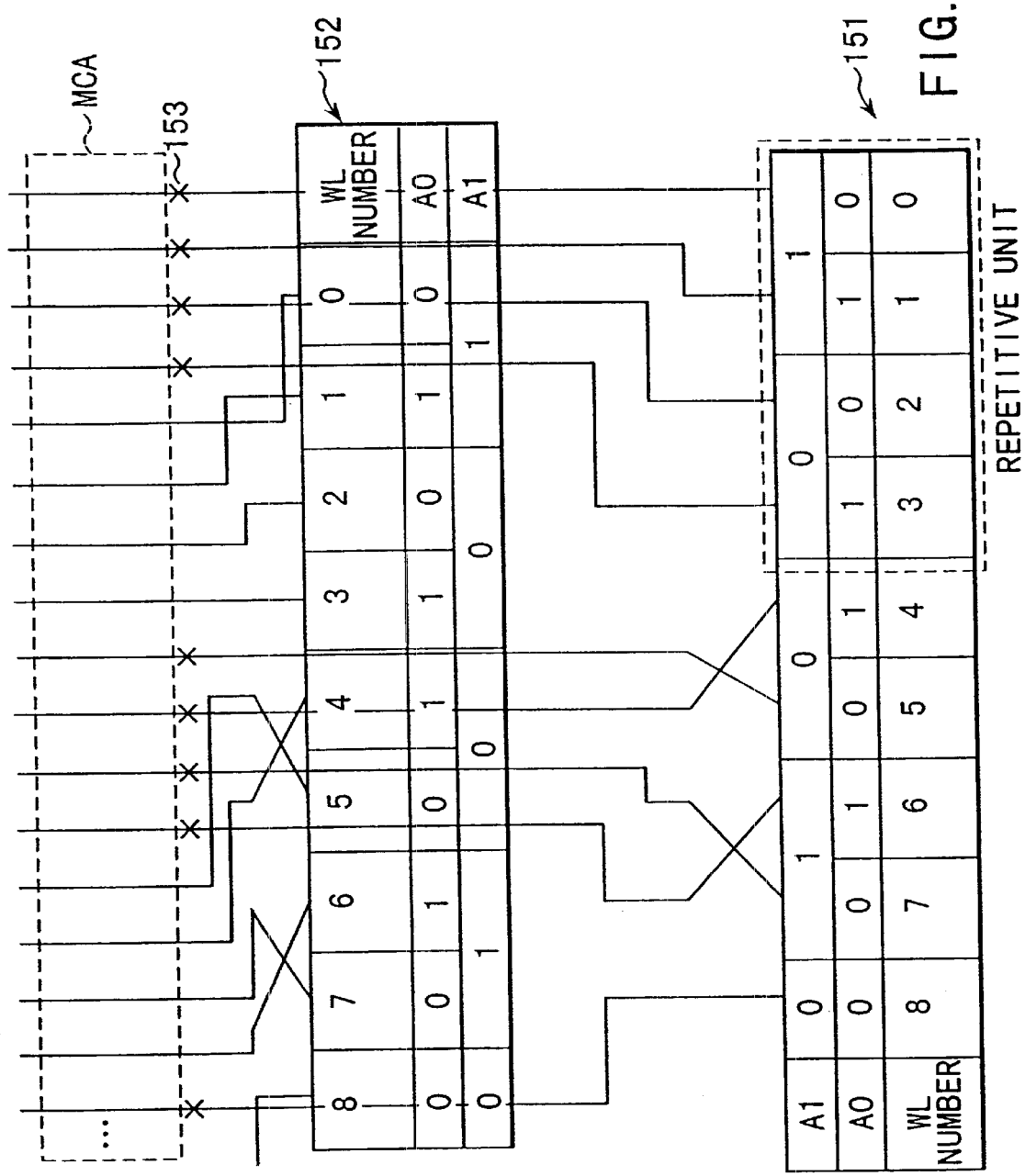
FIG. 26 is a schematic view showing an example of address assignment according to a sixth embodiment of the present invention in which two-stage word-line decoders are arranged on one side of a memory cell array.

As shown in FIG. 26, word-line decoders 151 and 152 of two stages are arranged on one side of a memory cell array MCA. When the word-line decoder 152 is connected to word lines WL7 to WL4 and WL3 to WL0 by means of a first metal wiring layer M1, the word-line decoder 151, which is above the word-line decoder 152, is connected to the word lines WL7 to WL4 and WL3 to WL0 through contacts 153 by means of a second metal wiring layer M2. In this arrangement, address signals A0 and A1 of the word-line decoders 151 and 152 arranged on one side of the memory cell array MCA are so assigned that they are inverted in adjacent repetitive units and arranged symmetrically with each other. Moreover, an output terminal of the word-line decoder of one of the repetitive units in each stage, is connected to its corresponding word line so as to cross each other.

Even in the sixth embodiment, adjacent repetitive units of the word-line decoders 151 and 152 are inverted alternately and arranged symmetrically with each other as in the fifth embodiment, so that a contact and a wire located on a boundary portion of the repetitive units can be shared with the repetitive units. The chip size can thus be reduced. Since, moreover, the output terminal of one of repetitive units of the word-line decoder 151 is connected to that of one of repetitive units of the word-line decoder 152 so as to cross each other, a given stress can correctly be applied between all adjacent word lines in a test mode.

In the above sixth embodiment, when the word-line decoder 151 is connected to the word lines WL7 to WL4 and WL3 to WL0 by the first metal wiring layer M1, the word-line decoder 152 can be connected to these word lines by the second metal wiring layer M2 or the word-line decoder 151 can be connected to the word lines below the word-line decoder 152.

The number of stages of word-line decoders is not limited to two.

In the sixth embodiment, various modifications can be made as in the fifth embodiment.

For example, as shown in FIG. 23, the word lines WL0 and WL1 connected to the word-line decoder 151 can be connected so as to cross each other and so can be the word lines WL2 and WL3 connected thereto, while the word lines WL0 and WL1 connected to the word-line decoder 152 can be connected so as to cross each other and so can be the word lines WL2 and WL3 connected thereto. Furthermore, the sixth embodiment is not limited to the case where the crossing word lines have the same number for both the word-line decoders 151 and 152.

The crossing position is not limited to between the output terminal of a word-line decoder and a word line. As shown in FIG. 24, in word-line decoders 11-0 to 11-3, the output terminals of NAND circuits and the input terminals of inverter circuits in adjacent word-line decoders can be connected so as to cross each other. As shown in FIG. 25, in word-line decoders 11-0 to 11-3, one input terminal of a word-line decoder can be connected to that of its adjacent word-line decoder so as to cross each other. Moreover, as in the fourth embodiment, adjacent word-line decoders can have a power supply line and a contact in common.

The number of word lines need not be limited to four, provided that it is an even number. Similarly, the number of repetitive units of word-line decoders need not be limited to the above number, provided that it is an even number.

(Seventh Embodiment)

Figure 27:
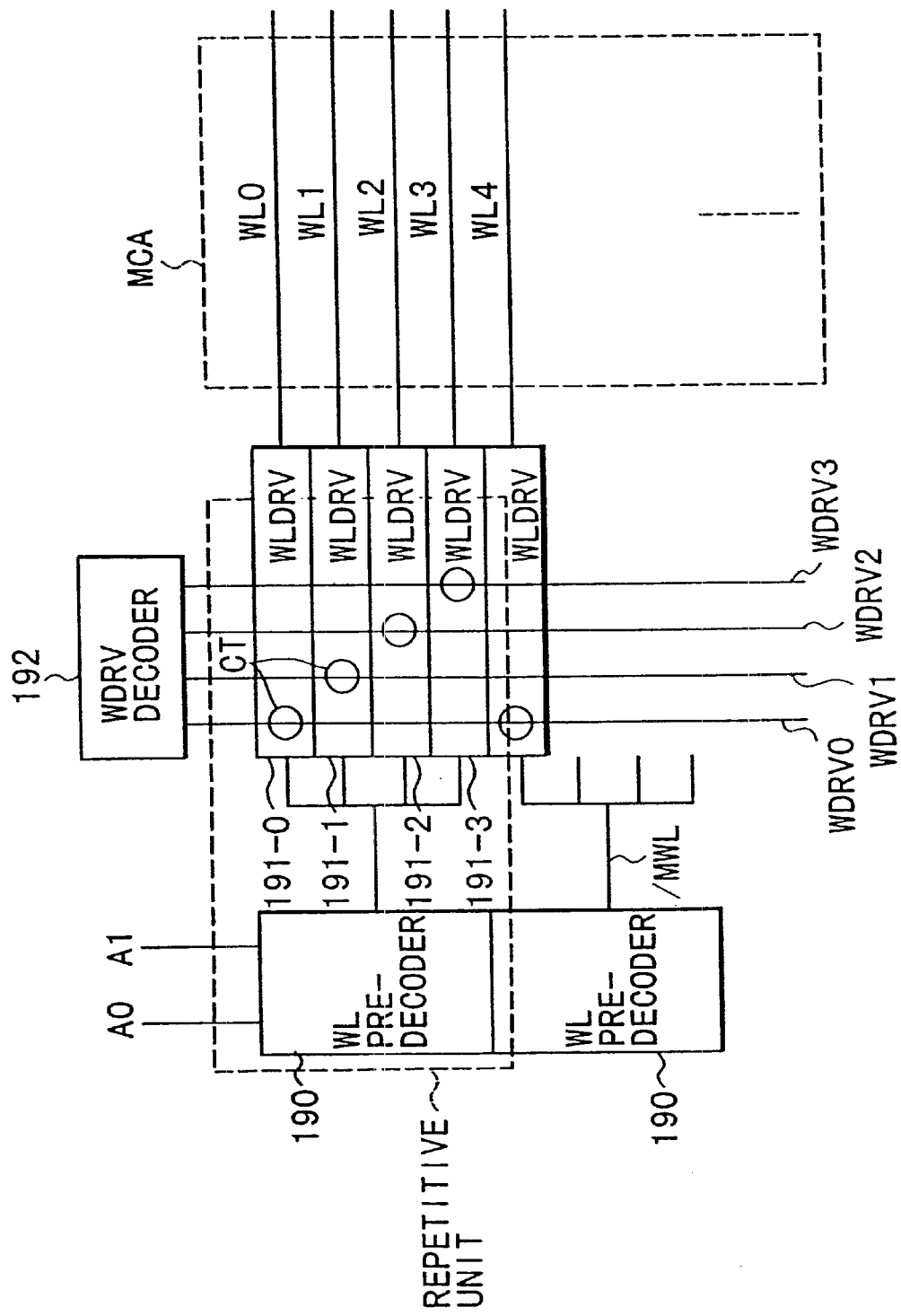
FIG. 27 is a schematic block diagram showing an example of a split word-line driving system.
Figure 28:
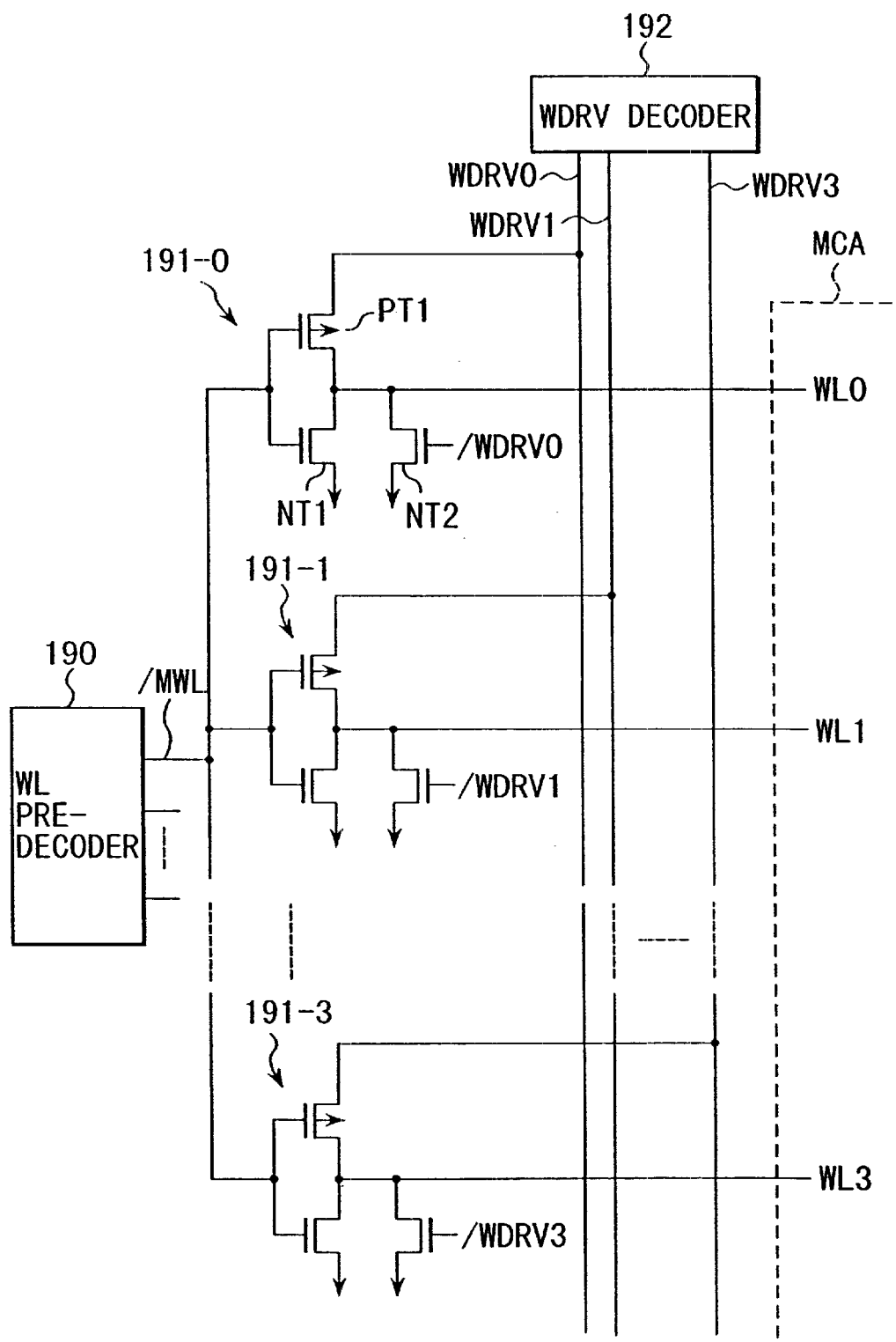
FIG. 28 is a circuit diagram of the split word-line driving system shown in FIG. 27.

FIG. 27 schematically shows the structure of a DRAM of a split word-line driving system. FIG. 28 illustrates a circuit arrangement of the DRAM shown in FIG. 27.

If the size of a memory cell array becomes large as a memory capacity increases, a word line for selecting a memory cell is lengthened. Since such a long word line has a large time constant, it takes a long time to rise the word line if the memory cell array is driven from one location. As one method for resolving this problem, a split word-line driving system has been developed in which a word line is split into plural ones to be driven. To apply the present invention to this system will now be described as a seventh embodiment of the present invention.

As illustrated in FIGS. 27 and 28, according to the split word-line driving system, a word line is split hierarchically into a plurality of main word lines /MWL and a plurality of word lines WL. A word-line predecoder (WL predecoder) 190 selects one of the main word lines /MWL in response to address signals A0 and A1. Word-line driving circuits (WLDRV) 191-0 to 191-3 apply word-line driving voltages WDRV0 to WDRV3, which are applied from a word-line driving voltage decoder (WDRV decoder) 192, to one of word lines WL0 to WL3 connected to the selected main word line /MWL. The word-line driving voltage decoder 192 outputs one of the word-line driving voltages WDRV0 to WDRV3 in response to an address signal (not shown).

The word-line driving circuits 191-0 to 191-3 are each constituted of a P-channel transistor PT1 and N-channel transistors NT1 and NT2. The gates of the P- and N-channel transistors PT1 and NT1 are connected to the main word lines /MWL. The sources of the P-channel transistors PT1 are supplied with their corresponding word-line driving voltages WDRV0 to WDRV3. The drains of the P-channel transistor PT1 and N-channel transistors NT1 and NT2 are connected to their corresponding word lines. The gates of the N-channel transistors NT2 are supplied with their corresponding word-line driving voltages /WDRV0 to /WDRV3. The sources of the N-channel transistors NT1 and NT2 are grounded.

When the word-line decoders of the split word-line driving system are arranged on only one side of a memory cell array MCA, the repetitive units can be arranged symmetrically with each other to connect the word lines so as to cross each other, as in the first embodiment.

Figure 29:
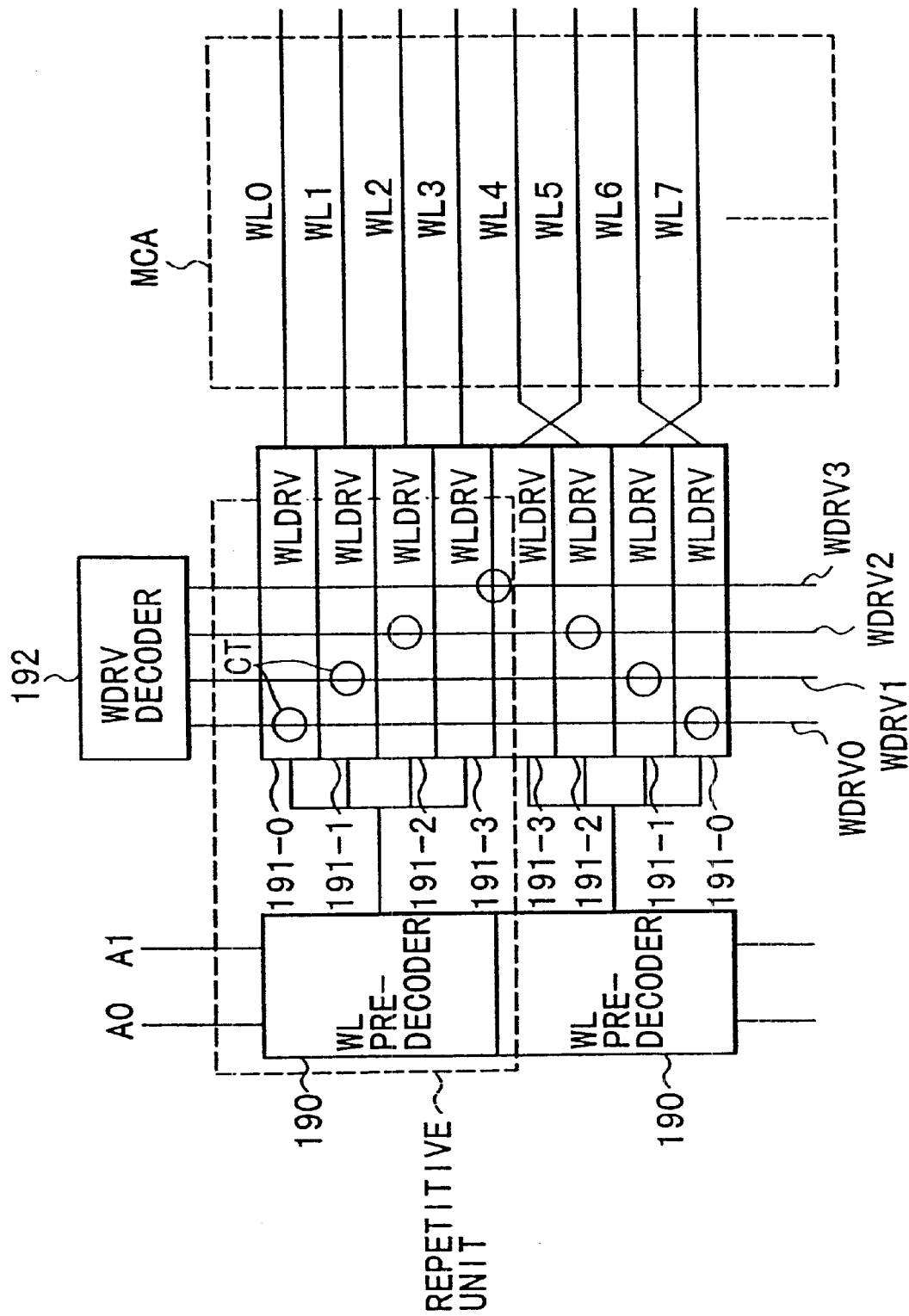
FIG. 29 is a schematic view of a split word-line driving system according to a seventh embodiment of the present invention in which a plurality of repetitive units are arranged symmetrically with each other.

FIG. 29 is directed to the seventh embodiment of the present invention. In this embodiment, a plurality of repetitive units constituted of word-line driving circuits 191-0 to 191-3 are arranged along a memory cell array and adjacent repetitive units are inverted alternately and thus arranged symmetrically with each other. In FIG. 29, CT (indicated by circle) represents a location of contact between the word-line driving circuits 191-0 to 191-3 and wires to which the word-line driving voltages WDRV0 to WDRV3 are applied. Since the plural repetitive units are symmetrical with each other, adjacent repetitive units can have a wire and a contact CT of both word-line driving circuits 191-3, which are located on a boundary portion of the adjacent repetitive units, in common.

Furthermore, the output terminals of the word-line driving circuits constituting one of adjacent repetitive units are connected to their corresponding word lines so as to cross each other. In this embodiment, the word line WL5 is connected to the word-line driving circuit 191-3, while the word-line WL4 is connected to the word-line driving circuit 191-2. The word line WL7 is connected to the word-line driving circuit 191-1, while the word line WL6 is connected to the word-line driving circuit 191-0.

Figure 30:
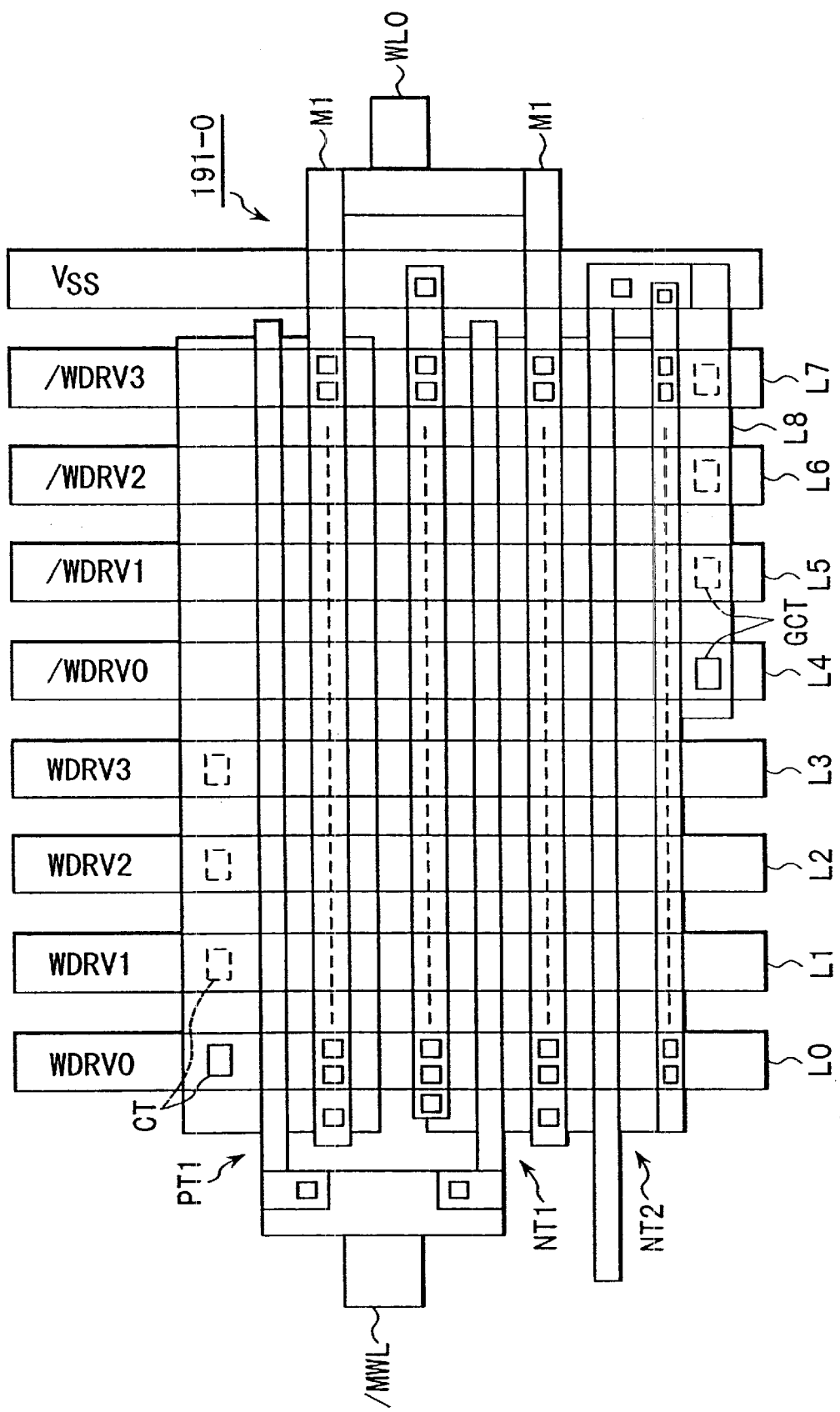
FIG. 30 is a schematic plan view showing a pattern layout of the word-line driving circuit of the split word-line driving system shown in FIG. 28.

FIG. 30 illustrates a pattern layout of the word-line driving circuit 191-0. In FIG. 30, the same elements as those of FIG. 28 are denoted by the same reference numerals. The basic arrangement of the word-line driving circuits 191-0 to 191-3 is the same as that of the word-line driving circuit 191-0, but the following are different: the locations of contacts CT between wires L0 to L3 supplied with word-line driving voltages WDRV0 to WDRV3 and diffusion layers constituting the sources of P-channel transistors PT1, and the locations of contacts GCT between wires L4 to L7 formed of second metal wiring layers M2 and the gates of N-channel transistors NT2. These contacts GCT are also connected toga wire L8 formed of a first metal wiring layer M1 and connected to the gate of the N-channel transistor NT2.

Figure 31:
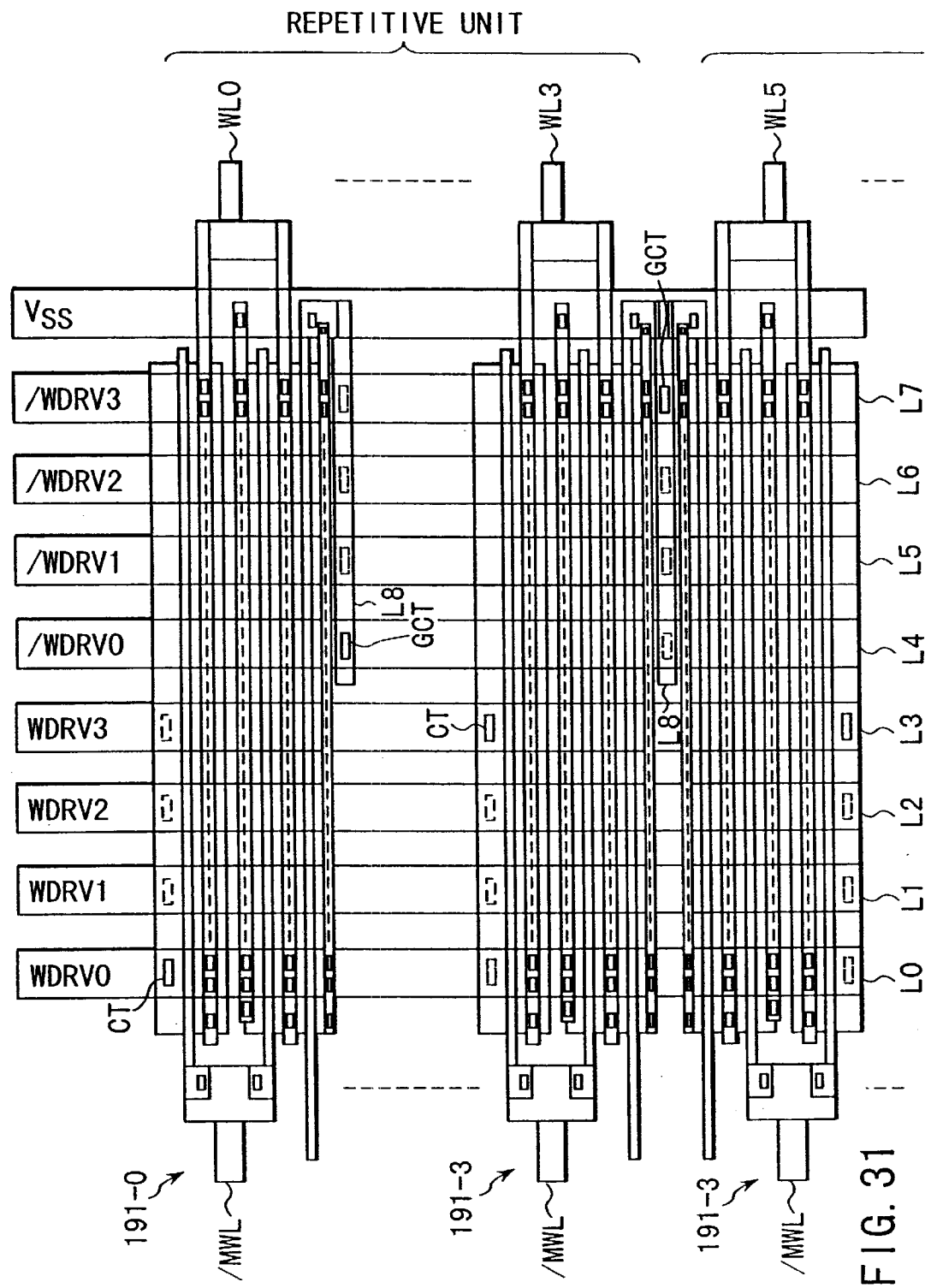
FIG. 31 is a schematic plan view showing a pattern layout of a split word-line driving system based on the word-line driving circuit of FIG. 30.

FIG. 31 shows an arrangement of the word-line driving circuits based on the pattern layout of FIG. 30. If, as shown in FIG. 31, the word-line driving circuits 191-0 to 191-3 are arranged symmetrically with each other, a wire L8 and a contact GCT of both the word-line driving circuits 191-3 located on a boundary portion of adjacent repetitive units can be shared with the adjacent repetitive units.

Figure 32:
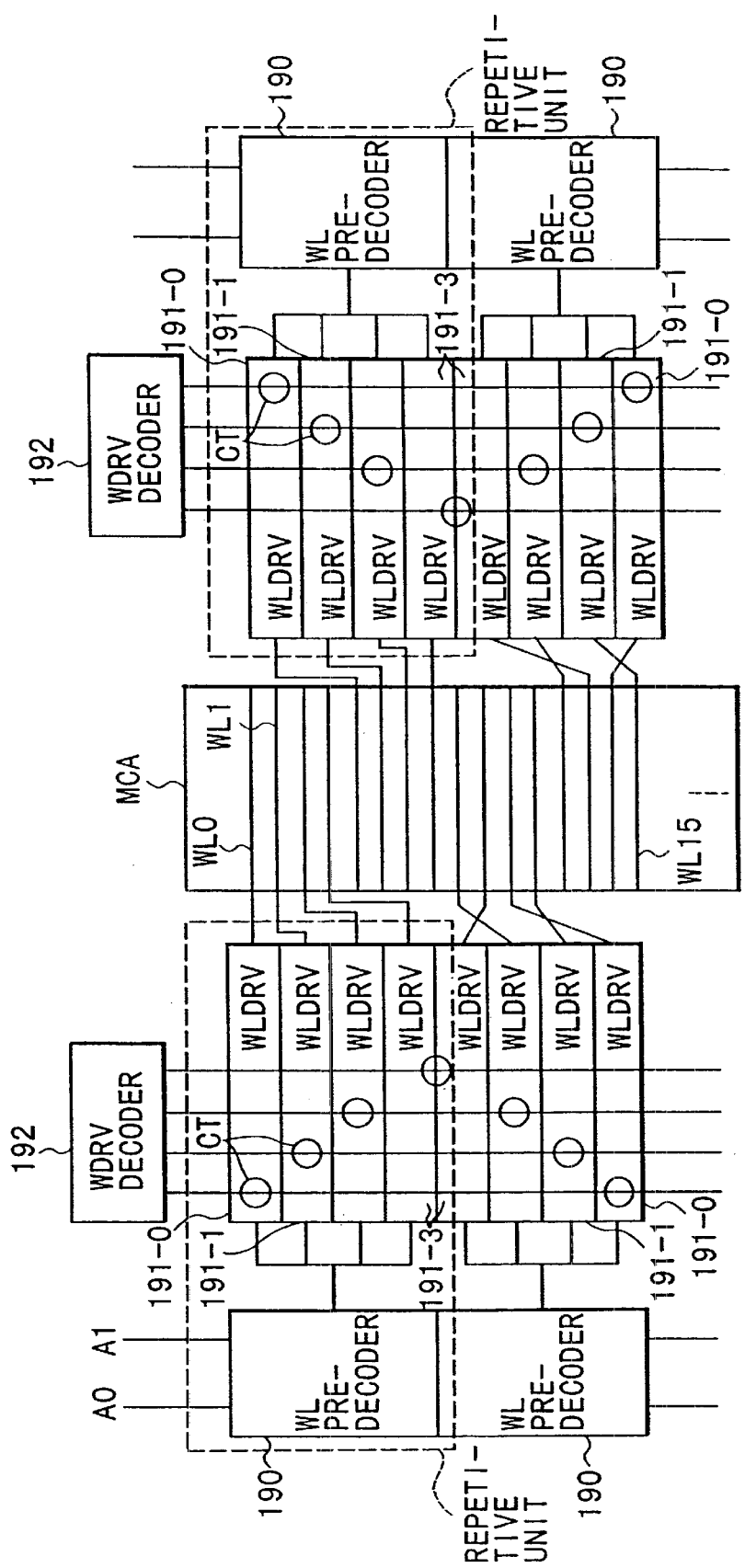
FIG. 32 is a schematic view of a split word-line driving system in which word-line driving circuits are arranged on both sides of a memory cell array.

FIG. 32 shows a modification to the arrangement illustrated in FIG. 29. In this modification, the word-line driving circuits shown in FIG. 29 are arranged on both sides of a memory cell array MCA. These word-line driving circuits drive word lines four by four.

In the split word-line driving system according to the seventh embodiment, the repetitive units including a plurality of word-line driving circuits are arranged symmetrically with each other. Therefore, a wire and a contact of both word-line driving circuits located on a boundary portion of adjacent repetitive units can be shared with the repetitive units, with the result that the decoder size can be decreased and so can be the chip size.

Moreover, the word lines of one of adjacent repetitive units cross each other and are connected to their corresponding word-line driving circuits. Thus, in the test mode, a stress voltage can correctly be applied between all adjacent word lines.

(Eighth Embodiment)

FIGS. 33 to 36 illustrate an eighth embodiment of the present invention. The eight embodiment is directed to a split word-line driving system in which word-line driving circuits are arranged on both sides of a memory cell array in which a memory cell is formed at one of two intersections between two bit lines and each of word lines.

Figure 33:
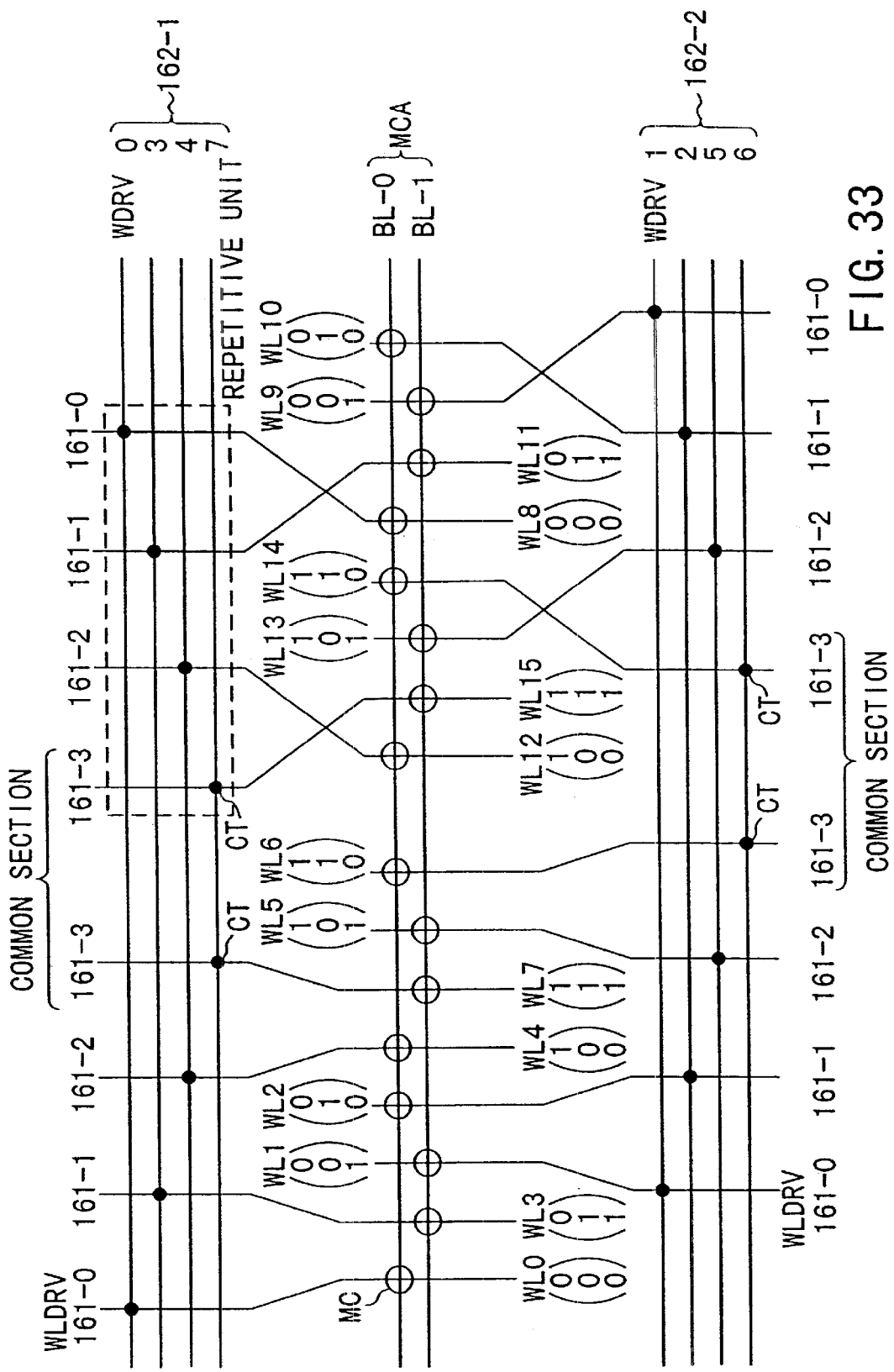
FIGS. 33 to 36 are schematic views of another split word-line driving system according to an eighth embodiment of the present invention, in which word-line driving circuits are arranged on both sides of a memory cell array.

FIG. 33 shows an example in which word-line driving circuits 161-0 to 161-3 are arranged on both sides of a memory cell array MCA and the memory cells MC (indicated by circles) and the word-line driving circuits 161-0 to 161-3 are arranged symmetrically with each other. In this example, the word-line driving circuits 161-0 to 161-3 drive word lines WL0 to WL15 two by two.

More specifically, a plurality of repetitive units constituted of the word-line driving circuits 161-0 to 161-3 are arranged along the memory cell array MCA, and adjacent repetitive units are inverted alternately and arranged symmetrically with each other. The plural repetitive units are symmetrical with each other. Therefore, of contacts CT between the word-line driving circuits 161-0 to 161-3 and the wires to which word-line driving voltages (WDRV0, WDRV3, WDRV4, WDRV7, WDRV1, WDRV2, WDRV5, and WDRV6) are applied from word-line driving voltage decoders (WDRV decoders) 162-1 and 162-2, a wire and a contact CT of both the word-line driving circuits 161-3 located on a boundary portion of adjacent repetitive units can be shared with the repetitive units.

Moreover, the output terminals of the plural word-line driving circuits constituting one of adjacent repetitive units are connected to their corresponding word lines so as to cross each other. In the WDRV decoder 162-1, the word line WL8 is connected to the word-line driving circuit 161-0, while the word line WL11 is connected to the word-line driving circuit 161-1. The word-line WL12 is connected to the word-line driving circuit 161-2, while the word line WL15 is connected to the word-line driving circuit 161-3. Similarly, in the WDRV decoder 162-2, the word line WL9 is connected to the word-line driving circuit 161-0, while the word line WL10 is connected to the word-line driving circuit 161-1. The word line WL13 is connected to the word-line driving circuit 161-2, while the word line WL14 is connected to the word-line driving circuit 161-3. Thus, in the test mode, a stress voltage can correctly be applied between all adjacent word lines.

The memory cells MC are located at intersections between the bit line BL-0 and the word lines WL0, WL2, WL4, WL6, WL12, WL14, WL8 and WL10 and at intersections between the bit line BL-1 and the word lines WL3, WL1, WL7, WL5, WL15, WL13, WL11 and WL9.

If, as shown in FIG. 33, address signals for driving the word lines WL0 to WL15 are represented by A0, A1 and A2 from the lower-order bit, the address signal A0 corresponds to locations (bit lines BL-0, BL-1) of the memory cells MC on the word lines. Since, in the address signal A1, "0" and "1" are always alternated with each other, it can be used as a stress pattern for applying a stress voltage of (Vpp−Vss) (A bit for determining the stress pattern is not limited to the least significant bit).

Figure 34:
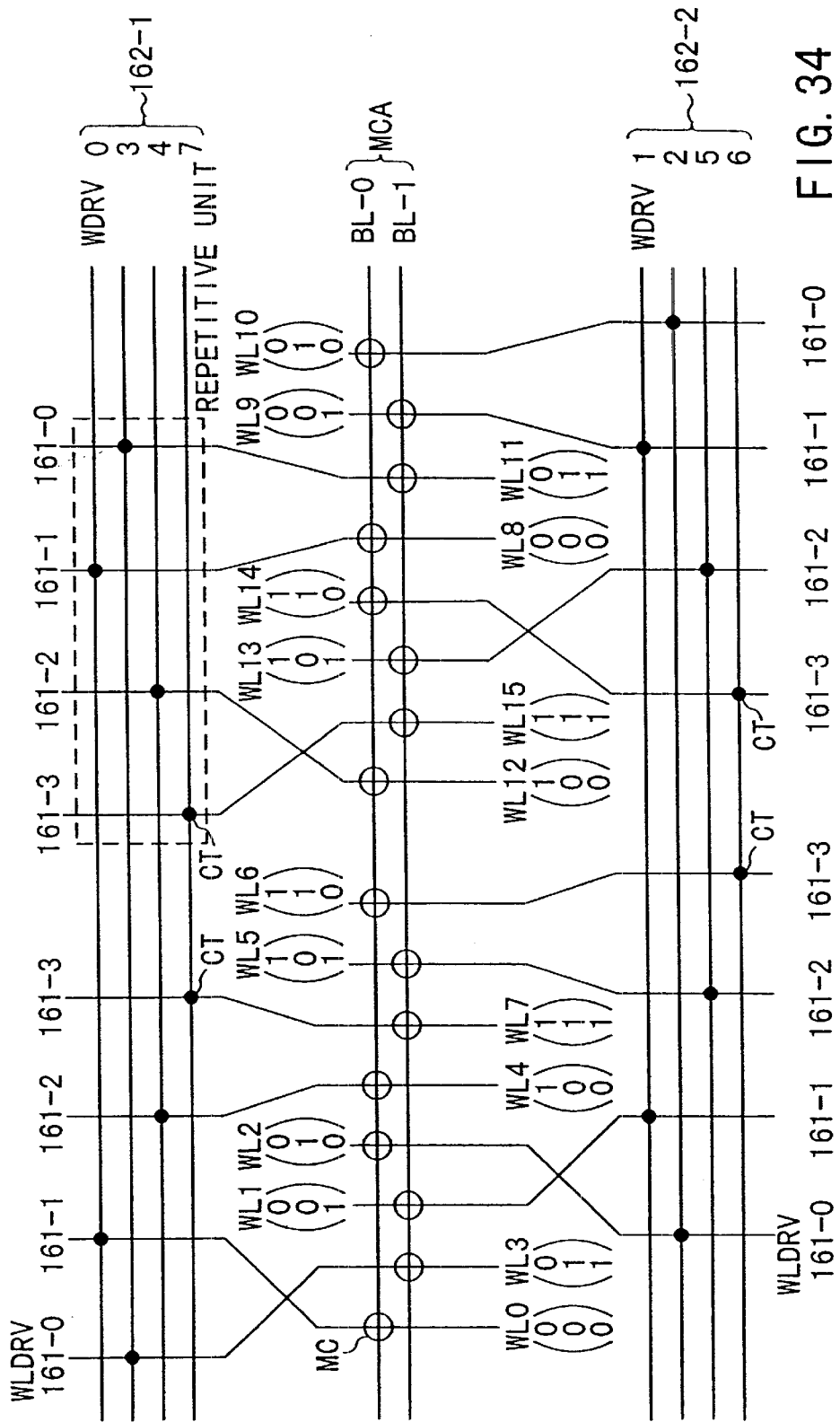

FIG. 34 shows a modification to the example of FIG. 33. In FIG. 34, the same elements as those of FIG. 33 are indicated by the same reference numerals and their detailed descriptions are omitted.

In this modification, in the WDRV decoder 162-1, the word line WL12 is connected to the word-line driving circuit 161-2, while the word line WL15 is connected to the word-line driving circuit 161-3. The word-line WL0 is connected to the word-line driving circuit 161-1, while the word line WL3 is connected to the word-line driving circuit 161-0. Similarly, in the WDRV decoder 162-2, the word line WL13 is connected to the word-line driving circuit 161-2, while the word line WL14 is connected to the word-line driving circuit 161-3. The word line WL1 is connected to the word-line driving circuit 161-1, while the word line WL2 is connected to the word-line driving circuit 161-0. In this arrangement, too, the same advantage as that of. FIG. 33 can be obtained.

Figure 35:
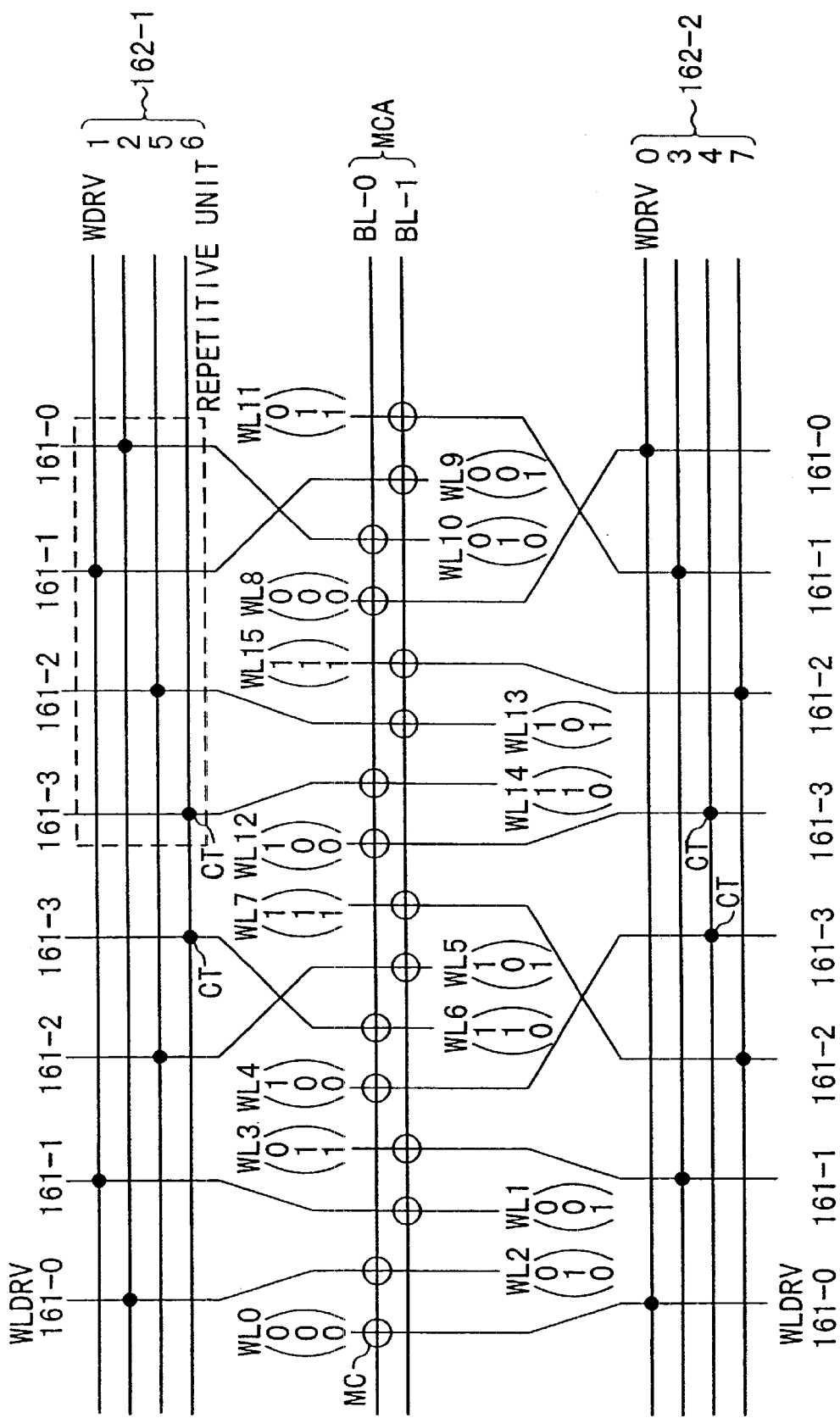

FIG. 35 shows an example in which word-line driving circuits 161-0 to 161-3 are arranged on both sides of a memory cell array MCA and the word-line driving circuits 161-0 to 161-3 are arranged symmetrically with each other. In this example, the word-line driving circuits 161-0 to 161-3 drive word lines WL0 to WL15 two by two.

More specifically, a plurality of repetitive units constituted of the word-line driving circuits 161-0 to 161-3 are arranged along the memory cell array MCA, and adjacent repetitive units are inverted alternately and arranged symmetrically with each other. The plural repetitive units are symmetrical with each other. Therefore, of contacts CT between the word-line driving circuits 161-0 to 161-3 and the wires to which word-line driving voltages (WDRV1, WDRV2, WDRV5, WDRV6, WDRV0, WDRV3, WDRV4, and WDRV7) are applied from word-line driving voltage decoders (WDRV decoders) 162-1 and 162-2, a wire and a contact CT of both the word-line driving circuits 161-3 located on a boundary portion of adjacent repetitive units can be shared with the repetitive units.

Moreover, the output terminals of the plural word-line driving circuits constituting one of adjacent repetitive units are connected to their corresponding word lines so as to cross each other. In the WDRV decoder 162-1, the word line WL10 is connected to the word-line driving circuit 161-0, while the word line WL9 is connected to the word-line driving circuit 161-1. The word-line WL5 is connected to the word-line driving circuit 161-2, while the word line WL6 is connected to the word-line driving circuit 161-3. Similarly, in the WDRV decoder 162-2, the word line WL8 is connected to the word-line driving circuit 161-0, while the word line WL11 is connected to the word-line driving circuit 161-1. The word line WL7 is connected to the word-line driving circuit 161-2, while the word line WL4 is connected to the word-line driving circuit 161-3. Thus, in the test mode, a stress voltage can correctly be applied between all adjacent word lines.

The memory cells MC are located at intersections between the bit line BL-0 and the word lines WL0, WL2, WL4, WL6, WL12, WL14, WL8 and WL10 and at intersections between the bit line BL-1 and the word lines WL1, WL3, WL5, WL7, WL13, WL15, WL19 and WL11.

If, as shown in FIG. 35, address signals for driving the word lines WL0 to WL15 are represented by A0, A1 and A2 from the lower-order bit, the address signal A0 corresponds to locations (bit lines BL-0, BL-1) of the memory cells MC on the word lines. Since, in the address signal A1, "0" and "1" are always alternated with each other, it can be used as a stress pattern for applying a stress voltage of (Vpp−Vss) (A bit for determining the stress pattern is not limited to the least significant bit).

Since, furthermore, the word-line driving circuits 161-0, which are arranged on both sides of the memory cell array and located at each end thereof, can be aligned with each other, a space can be made smaller than that in the examples of FIGS. 33 and 34.

Figure 36:
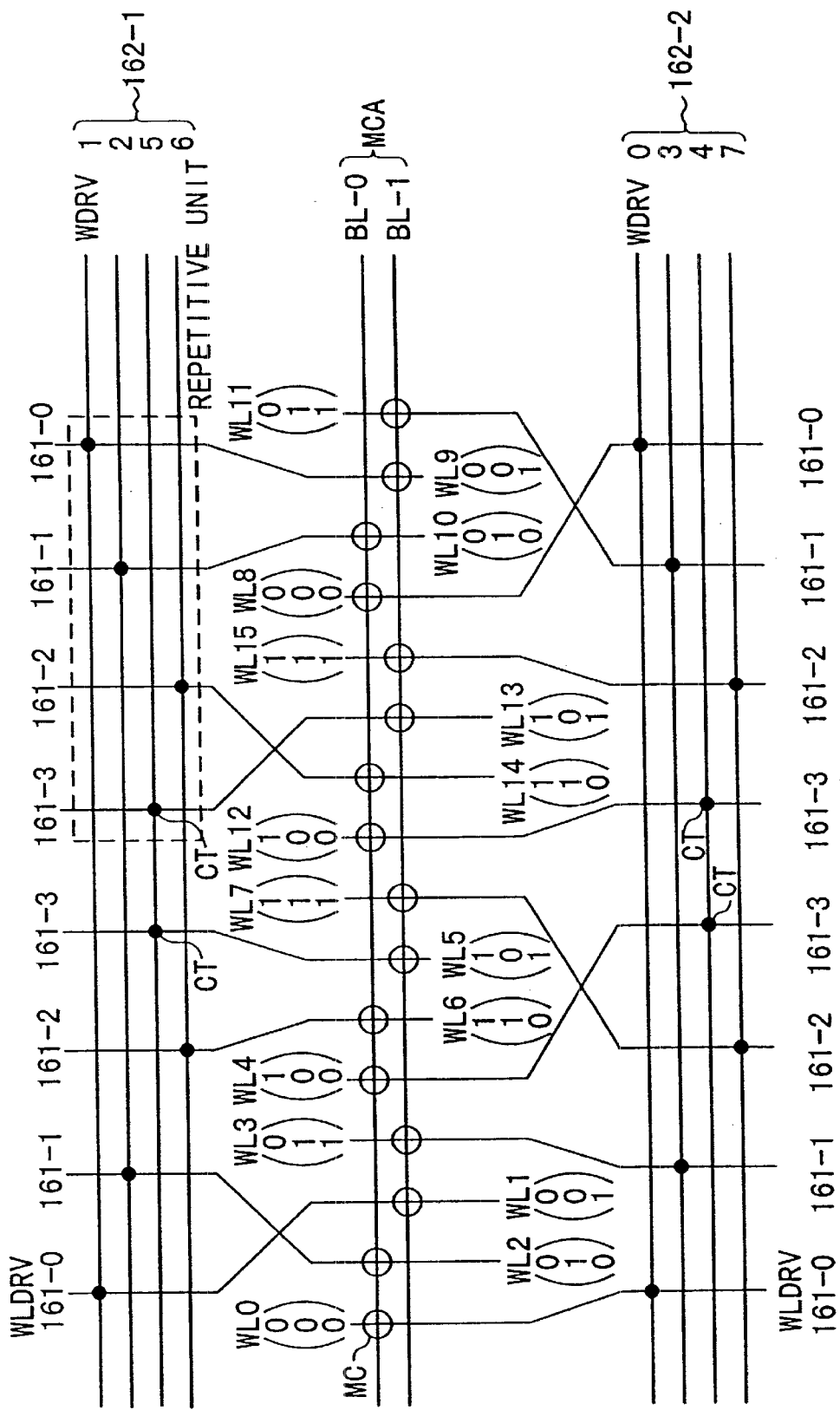

FIG. 36 shows a modification to the example of FIG. 35. In FIG. 36, the same elements as those of FIG. 35 are indicated by the same reference numerals and their detailed descriptions are omitted.

In this modification, in the WDRV decoder 162-1, the word line WL14 is connected to the word-line driving circuit 161-2, while the word line WL13 is connected to the word-line driving circuit 161-3. The word-line WL2 is connected to the word-line driving circuit 161-1, while the word line WL1 is connected to the word-line driving circuit 161-0. Similarly, in the WDRV decoder 162-2, the word line WL8 is connected to the word-line driving circuit 161-0, while the word line WL11 is connected to the word-line driving circuit 161-1. The word line WL4 is connected to the word-line driving circuit 161-3, while the word line WL7 is connected to the word-line driving circuit 161-2. In this arrangement, too, the same advantage as that of FIG. 35 can be obtained.

Even in the split word-line driving system of the eighth embodiment, as in the seventh embodiment, the area of the word-line driving circuits can be reduced and thus the size of the chip can be decreased. Further, in the test mode, a stress voltage can correctly be applied between all adjacent word lines.

The foregoing first to eighth embodiments are directed to a DRAM, but the present invention is not limited to the DRAM. For example, it can be applied to a static RAM, an EEPROM, and a logic integrated circuit.

Needless to say, the present invention is not limited to the above embodiments, but various changes and modifications can be made without departing from the scope of the subject matter of the invention.

According to the present invention described above, a wire and a contact located on a boundary portion of adjacent first and second repetitive units, can be shared with the repetitive units. Thus, the layout area of word-line decoders can be reduced. Consequently, there can be provided a semiconductor device capable of reducing in chip area and decreasing in chip manufacturing costs.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array including a plurality of memory cells arranged in rows and columns;
a plurality of word lines connected to the plurality of memory cells of one row, respectively, the plurality of word lines including first to eighth word lines arranged in order in the memory cell array; and
first to eighth decoders which select the first to eighth word lines, respectively, wherein the second decoder and the sixth decoder have a wire and a contact in common.

2. A semiconductor memory device according to claim 1, wherein the first, second, fifth and sixth decoders are included in a first decoder section, the third, fourth, seventh and eighth decoders are included in a second decoder section, and the memory cell array is interposed between the first and second decoder sections.

3. A semiconductor memory device according to claim 1, wherein the fourth and eighth decoders have a wire and a contact in common.

4. A semiconductor memory device according to claim 2, wherein the fourth and eighth decoders have a wire and a contact in common.

5. A semiconductor memory device according to claim 4, wherein the first to eighth decoders each has a first logic circuit and a second logic circuit connected in series to the first logic circuit, and an output terminal of the second logic circuit of the fifth decoder crosses an output terminal of the second logic circuit of the sixth decoder.

6. A semiconductor memory device according to claim 5, wherein an output terminal of the second logic circuit of the seventh decoder crosses an output terminal of the second logic circuit of the eighth decoder.

7. A semiconductor memory device according to claim 4, wherein the first to eighth decoders each has a first logic circuit and a second logic circuit connected in series to the first logic circuit, and an output terminal of the first logic circuit of the fifth decoder crosses an output terminal of the first logic circuit of the sixth decoder.

8. A semiconductor memory device according to claim 7, wherein an output terminal of the first logic circuit of the seventh decoder crosses an output terminal of the first logic circuit of the eighth decoder.

9. A semiconductor memory device according to claim 4, wherein the first to eighth decoders each has a first logic circuit and a second logic circuit connected in series to the first logic circuit, and an input terminal of the first logic circuit of the fifth decoder crosses an input terminal of the first logic circuit of the sixth decoder.

10. A semiconductor memory device according to claim 9, wherein an input terminal of the first logic circuit of the seventh decoder crosses an input terminal of the first logic circuit of the eighth decoder.

11. A semiconductor memory device according to claim 1, wherein the second, third, sixth and seventh decoders are included in a first decoder section, the first, fourth, fifth and eighth decoders are included in a second decoder section, and the memory cell array is interposed between the first and second decoder sections.

12. A semiconductor memory device according to claim 1, wherein the first and fifth decoders have a wire and a contact in common.

13. A semiconductor memory device according to claim 11, wherein the first and fifth decoders have a wire and a contact in common.

14. A semiconductor memory device according to claim 13, wherein the first to eighth decoders each has a first logic circuit and a second logic circuit connected in series to the first logic circuit, and an output terminal of the second logic circuit of the second decoder crosses an output terminal of the second logic circuit of the third decoder.

15. A semiconductor memory device according to claim 14, wherein an output terminal of the second logic circuit of the first decoder crosses an output terminal of the second logic circuit of the fourth decoder.

16. A semiconductor memory device according to claim 13, wherein the first to eighth decoders each has a first logic circuit and a second logic circuit connected in series to the first logic circuit, and an output terminal of the first logic circuit of the second decoder crosses an output terminal of the first logic circuit of the third decoder.

17. A semiconductor memory device according to claim 16, wherein an output terminal of the first logic circuit of the first decoder crosses an output terminal of the first logic circuit of the fourth decoder.

18. A semiconductor memory device according to claim 13, wherein the first to eighth decoders each has a first logic circuit and a second logic circuit connected in series to the first logic circuit, and an input terminal of the first logic circuit of the second decoder crosses an input terminal of the first logic circuit of the third decoder.

19. A semiconductor memory device according to claim 18, wherein an input terminal of the first logic circuit of the first decoder crosses an input terminal of the first logic circuit of the fourth decoder.

20. A semiconductor memory device comprising:
a memory cell array including a plurality of memory cells arranged in rows and columns;
a plurality of word lines connected to the plurality of memory cells of one row, respectively, the plurality of word lines including first to eighth word lines arranged in order in the memory cell array, and
first to eighth decoders that select the first to eighth word lines, respectively,
wherein the third decoder and the seventh decoder have a wire and a contact in common.

21. A semiconductor memory device according to claim 20, wherein the second, third, sixth and seventh decoders are included in a first decoder section, the first, fourth, fifth and eighth decoders are included in a second decoder section, and the memory cell array is interposed between the first and second decoder sections.

22. A semiconductor memory device according to claim 20, wherein the first and fifth decoders have a wire and a contact in common.

23. A semiconductor memory device according to claim 21, wherein the first and fifth decoders have a wire and a contact in common.

24. A semiconductor memory device according to claim 23, wherein the first to eighth decoders each has a first logic circuit and a second logic circuit connected in series to the first logic circuit, and an output terminal of the second logic circuit of the sixth decoder crosses an output terminal of the second logic circuit of the seventh decoder.

25. A semiconductor memory device according to claim 24, wherein an output terminal of the second logic circuit of the first decoder crosses an output terminal of the second logic circuit of the fourth decoder.

26. A semiconductor memory device according to claim 23, wherein the first to eighth decoders each has a first logic circuit and a second logic circuit connected in series to the first logic circuit, and an output terminal of the first logic circuit of the sixth decoder crosses an output terminal of the first logic circuit of the seventh decoder.

27. A semiconductor memory device according to claim 26, wherein an output terminal of the first logic circuit of the first decoder crosses an output terminal of the first logic circuit of the fourth decoder.

28. A semiconductor memory device according to claim 23, wherein the first to eighth decoders each has a first logic circuit and a second logic circuit connected in series to the first logic circuit, and an input terminal of the first logic circuit of the sixth decoder crosses an input terminal of the first logic circuit of the seventh decoder.

29. A semiconductor memory device according to claim 28, wherein an input terminal of the first logic circuit of the first decoder crosses an input terminal of the first logic circuit of the fourth decoder.

30. A semiconductor memory device comprising:
a memory cell array including a plurality of memory cells arranged in rows and columns;
a plurality of word lines connected to the plurality of memory cells of one row, respectively, and arranged in order in the memory cell array; and
decoders that select the plurality of word lines, respectively,
wherein the decoders include a pair of decoders having a wire and a contact in common, and $(2^N-1)$ (N: natural number) word lines are interposed between word lines driven by the pair of decoders.

31. A semiconductor memory device according to claim 30, wherein a word line driven by a decoder included in the pair of decoders crosses another word line.

32. A semiconductor memory device according to claim 30, wherein the decoders each has a first logic circuit and a second logic circuit connected in series to the first logic circuit, and an output terminal of the second logic circuit of a decoder included in the pair of decoders crosses an output terminal of the second logic circuit of another decoder.

33. A semiconductor memory device according to claim 30, wherein the decoders each has a first logic circuit and a second logic circuit connected in series to the first logic circuit, and an output terminal of the first logic circuit of a decoder included in the pair of decoders crosses an output terminal of the first logic circuit of another decoder.

34. A semiconductor memory device according to claim 30, wherein the decoders each has a fist logic circuit and a second logic circuit connected in series to he first logic circuit, and an input terminal of the first logic circuit of a decoder included in the pair of decoders crosses an input terminal of the first logic circuit of another decoder.

* * * * *

UNITED STATES PATENT AND TRADEMARK OFFICE
CERTIFICATE OF CORRECTION

PATENT NO. : 6,560,163 B2
DATED : May 6, 2003
INVENTOR(S) : Hironobu Akita et al.

It is certified that error appears in the above-identified patent and that said Letters Patent is hereby corrected as shown below:

Title page,
Item [30], Foreign Application Priority Data, "10-361406" has been replaced with -- 11-361406 --;

Column 20,
Line 40, "fist" has been replaced with -- first --;
Line 41, "he" has been replaced with -- the --.

Signed and Sealed this

Seventh Day of October, 2003

JAMES E. ROGAN
*Director of the United States Patent and Trademark Office*